(12) United States Patent
Miyashita et al.

(10) Patent No.: US 10,591,662 B2
(45) Date of Patent: Mar. 17, 2020

(54) PLANAR LIGHT UNIT

(71) Applicants: CITIZEN ELECTRONICS CO., LTD., Yamanashi-ken (JP); CITIZEN WATCH CO., LTD., Tokyo (JP)

(72) Inventors: Junji Miyashita, Yamanashi-ken (JP); Tomoo Udagawa, Yamanashi-ken (JP)

(73) Assignees: CITIZEN ELECTRONICS CO., LTD., Yamanashi-Ken (JP); CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 16/066,453

(22) PCT Filed: Jan. 13, 2017

(86) PCT No.: PCT/JP2017/001060
§ 371 (c)(1),
(2) Date: Jun. 27, 2018

(87) PCT Pub. No.: WO2017/122794
PCT Pub. Date: Jul. 20, 2017

(65) Prior Publication Data
US 2019/0018184 A1    Jan. 17, 2019

(30) Foreign Application Priority Data

Jan. 15, 2016  (JP) ................... 2016-005764
Mar. 25, 2016  (JP) ................... 2016-061992

(51) Int. Cl.
*F21V 8/00*    (2006.01)
*G02F 1/1335*  (2006.01)
(Continued)

(52) U.S. Cl.
CPC ......... *G02B 6/0073* (2013.01); *G02B 6/0025* (2013.01); *G02B 6/0091* (2013.01);
(Continued)

(58) Field of Classification Search
CPC . G02B 6/0073; G02F 1/133603; H01L 33/50; H01L 33/56
See application file for complete search history.

(56) References Cited

U.S. PATENT DOCUMENTS 8,502,935 B2     8/2013  Nakamoto et al.
2003/0123245 A1*  7/2003  Parker .................. A61M 21/02
                                            362/602
(Continued)

FOREIGN PATENT DOCUMENTS

JP    2004-241237    8/2004
JP    2008-053013    3/2008
(Continued)

OTHER PUBLICATIONS

International Search Report dated Feb. 28, 2017 in International (PCT) Application No. PCT/JP2017/001060.
(Continued)

*Primary Examiner* — Mary Ellen Bowman
(74) *Attorney, Agent, or Firm* — Wenderoth, Lind & Ponack, L.L.P.

(57) ABSTRACT

To provide a planar light unit that optically and mechanically connects a light-emitting device and a light guide plate to each other in a stable manner so as to improve luminous efficiency and brightness uniformity on a light exit surface. A planar light unit 40 includes: a light guide plate 2, which includes a light incident portion 2f on a side edge of the light guide plate 2; a light-emitting device 3, which is configured to emit light into an inside of the light guide plate 2 through the light incident portion 2f; and a light source board 4, on which the light-emitting device 3 is mounted. The light incident portion 2f includes a recess 2a and a reflecting-shaped portion 2b. A flexible resin 6, which has a light-transmitting property and a flexibility, is disposed between a light incident surface 2c, which is formed on the recess 2a, and the light-emitting device 3.

16 Claims, 20 Drawing Sheets

(51) Int. Cl.
*H01L 33/50* (2010.01)
*H01L 33/56* (2010.01)

(52) U.S. Cl.
CPC ........ *G02F 1/133603* (2013.01); *H01L 33/50* (2013.01); *H01L 33/56* (2013.01); *G02B 6/0021* (2013.01); *G02B 6/0085* (2013.01); *G02B 6/0093* (2013.01)

(56) References Cited

U.S. PATENT DOCUMENTS

| | | | |
|---|---|---|---|
| 2004/0218376 A1* | 11/2004 | Ng | G02B 6/0061 362/611 |
| 2008/0049168 A1* | 2/2008 | Kubota | G02B 6/0021 349/65 |
| 2009/0059127 A1* | 3/2009 | Nakamoto | G02B 6/002 349/65 |

FOREIGN PATENT DOCUMENTS

| | | |
|---|---|---|
| JP | 2009-058846 | 3/2009 |
| JP | 2013-258359 | 12/2013 |
| JP | 2014-027266 | 2/2014 |
| JP | 2015-103351 | 6/2015 |

OTHER PUBLICATIONS

International Preliminary Report on Patentability dated Feb. 28, 2017 in International (PCT) Application No. PCT/JP2017/001060.

* cited by examiner

PLANAR LIGHT UNIT

TECHNICAL FIELD

The present application relates to a planar light unit that illuminates a liquid-crystal display panel or another display panel from the back side of the panel.

BACKGROUND ART

Liquid-crystal display devices have been widely used to display images on mobile phones, tablet terminals, personal computers, car navigations, and other such devices. Such liquid-crystal display devices employ a planar light unit disposed on the back side of a liquid-crystal display panel to emit light in a planar fashion.

In some cases, in order to make the planar light units thinner, a light source is disposed on a side edge (hereinafter referred to as "light incident portion") of a light guide plate, and light is allowed to enter a light incident surface of the light incident portion and to exit through a main surface (hereinafter referred to as "light exit surface") (the method by which the light that has entered through the side edge of the light guide plate exits through the light exit surface of the light guide plate will be hereinafter referred to as "sidelight method"). The planar light units employing this sidelight method are faced with a problem in improving luminous efficiency and brightness uniformity on the light exit surface, and various proposals have been made on this problem (for example, patent document 1).

A planar light unit recited in patent document 1 will be described below by referring to the drawings.

FIG. 21 is a perspective view of a light guide plate 120, which is included in the planar light unit recited in patent document 1. The light guide plate 120 is made by processing a light-transmitting resin such as an acrylic resin into a planar shape. A light incident portion 121 of the light guide plate 120 includes a recess 122, to which an LED 111 is to be inserted. On the top and bottom of the recess 122, reflecting-shaped portions 123 are formed. A sectional view of the light guide plate 120 along its light propagation direction shows that the reflecting-shaped portions 123 are curved portions at the top and bottom of the light guide plate 120.

FIG. 22 is a partial sectional view of a surrounding area of the light incident portion 121 of the light guide plate 120 illustrated in FIG. 21, with the LED 111 mounted in the recess 122. The portion illustrated in FIG. 22 will be hereinafter referred to as "light source 130". The light source 130 includes the recess 122, the light incident portion 121, a light source board 110, the LED 111 (semiconductor light-emitting device), and a microlens 131. The reflecting-shaped portions 123 include the light incident portion 121. The LED 111 is mounted on the light source board 110. The microlens 131 covers the LED 111.

A plurality of LEDs 111, not illustrated, are arranged in a row on the light source board 110, which has a rectangular plate shape. The LEDs 111 include a red LED, a green LED, and a blue LED, which emit different colors. The light source board 110 is attached to the light incident portion 121 with double-sided tape. The recess 122 houses each of the LEDs 111.

In the above-described planar light unit, since the LEDs 111 are housed in the recess 122, light emitted from the LEDs 111 enters the light guide plate 120 efficiently. Moreover, the reflecting-shaped portions 123 totally reflect the light that would otherwise leak from the light guide plate 120 and confine the light to the light guide plate 120. In this manner, the planar light unit improves the use efficiency.

RELATED ART DOCUMENTS

Patent Documents

[Patent document 1] Japanese Unexamined Patent Application Publication No. 2008-53013 (FIGS. 2 and 3)

DISCLOSURE OF THE INVENTION

Problems to be Solved by the Invention

As described above, the planar light unit recited in patent document 1 efficiently guides the light emitted from the LEDs 111, which are mounted on the light source board 110, into the light guide plate 120. Specifically, see FIG. 2 and paragraph 0058 of patent document 1, which recites: "a light-transmitting resin with a high refractive index such as polycarbonate is filled between the surface of the recess of the light guide plate and the surfaces of the microlenses of the LEDs, so as to improve light-use efficiency of the light emitted from these LEDs." As can be understood from this description, the light-transmitting resin fixes the microlenses 131 and the recess 122 to each other. However, heat generation caused by light emission of the LEDs 111 and/or an increase in ambient temperature may cause the light guide plate 120 and/or the light source board 110 to thermally expand. This causes the portion fixing the microlenses 131 and the light incident portion 121 to each other to be peeled off or damaged.

To prevent damage caused by thermal expansion, one possible approach is to provide a gap between the microlenses 131 and the light incident portion 121, instead of fixing the microlenses 131 and the light incident portion 121 to each other. However, such a gap (air layer) causes Fresnel loss, lowering the luminous efficiency. Moreover, the width of the gap depends on dimensional errors in the light guide plate, the light source board, and a support frame supporting them. That is, the widths of such gaps in planar light units are caused to vary during production, making light emission properties of the planar light units unstable.

In light of the circumstances, an object of the present disclosure is to provide a planar light unit capable of solving the problem described above by keeping optical and mechanical connection between a semiconductor light-emitting device and a light guide plate stable in spite of dimensional errors and thermal expansion of components while ensuring increased incident efficiency of light entering the light guide plate from the semiconductor light-emitting device.

Means of Solving the Problems

In order to achieve the above-described object, in accordance with one or more embodiments of the present application, a planar light unit includes: a light guide plate including: a light incident portion on a side edge of the light guide plate; and a light exit surface on a top surface of the light guide plate; a semiconductor light-emitting device configured to emit light into an inside of the light guide plate through the light incident portion; and a light source board on which the semiconductor light-emitting device is mounted. The light incident portion includes a recess that is bored in parallel with the top surface and that includes a light incident surface. A reflecting-shaped portion is formed on at least one side among a top side and a bottom side of the light incident portion. A flexible resin having a light-transmitting property and a flexibility is disposed between the light incident surface and the semiconductor light-emitting device.

With the above-described configuration, in the planar light unit according to one or more embodiments the present application, the recess is formed on a side surface of the light guide plate. The recess includes the light incident surface, and the flexible resin having the light-transmitting property is disposed between the light incident surface and the semiconductor light-emitting device mounted on the light source board. This structure reduces variation of the refractive index in an optical path from a light emission surface of the semiconductor light-emitting device through the flexible resin to the light incident surface. This enables the light emitted from the semiconductor light-emitting device to efficiently enter the inside of the light guide plate.

Moreover, the reflecting-shaped portion is formed on the light incident portion of the light guide plate. This ensures that the light that is emitted from the semiconductor light-emitting device and that would otherwise leak from the light guide plate is totally reflected off the reflecting-shaped portion, and confined to the light guide plate. In this manner, in the planar light unit according to the present application, the light emitted from the semiconductor light-emitting device efficiently enters the light guide plate. Moreover, in the planar light unit according to the present application, the flexible resin is deformable to absorb processing errors of components and/or absorb dimensional changes in the components. This prevents the components from being damaged and properties from varying.

The flexible resin may have a Young's modulus of 0.1 to 1.0 MPa.

The flexible resin may have a refractive index of 1.4 to 1.6.

The flexible resin may be pressed by the semiconductor light-emitting device and the light incident surface.

A plurality of semiconductor light-emitting devices may be mounted on the light source board, and a single continuous flexible resin may be disposed to cover all of the plurality of semiconductor light-emitting devices.

A plurality of semiconductor light-emitting devices may be mounted on the light source board, and an individual flexible resin may be disposed at each of the plurality of semiconductor light-emitting devices.

The recess may include a plurality of individual housings each including a side reflective wall, and in each of the plurality of individual housings, the flexible resin may be disposed between the light incident surface and each of the plurality of semiconductor light-emitting devices.

The light source board may include a protrusion-shaped portion on which the semiconductor light-emitting device is mounted, and a leading end of the protrusion-shaped portion may be disposed inside the recess.

A plurality of LED dies may be mounted on the light source board, and the plurality of LED dies may be sealed by a sealing resin in such a collective manner that the semiconductor light-emitting device and the light source board are integral to each other.

The sealing resin may include the flexible resin.

The sealing resin may include a light-transmitting resin mixed with fluorescent particles.

The light guide plate may include at least two separate light guide plates, and the light guide plates may be optically connected with each other.

A connection portion of the light guide plates may have a wedge-shaped cross-section.

The light incident surface may have an uneven shape.

A color of light emitted from the semiconductor light-emitting device may be set to a longer wavelength than a wavelength of a chromaticity target of light that exits through the light exit surface.

Effects of the Invention

As described above, in the planar light unit according to the present application, a recess is formed on a side surface of a light guide plate and a light incident surface is disposed inside the recess. Moreover, in the planar light unit according to the present application, a light-transmitting flexible resin is disposed between the light incident surface and light emission surfaces of semiconductor light-emitting devices. As a result, in the planar light unit according to the present application, light emitted from the semiconductor light-emitting devices is efficiently guided into the inside of the light guide plate, and optical and mechanical connection is kept stable in spite of dimensional errors and thermal expansion of components.

MODE FOR CARRYING OUT THE INVENTION

Figure 1:
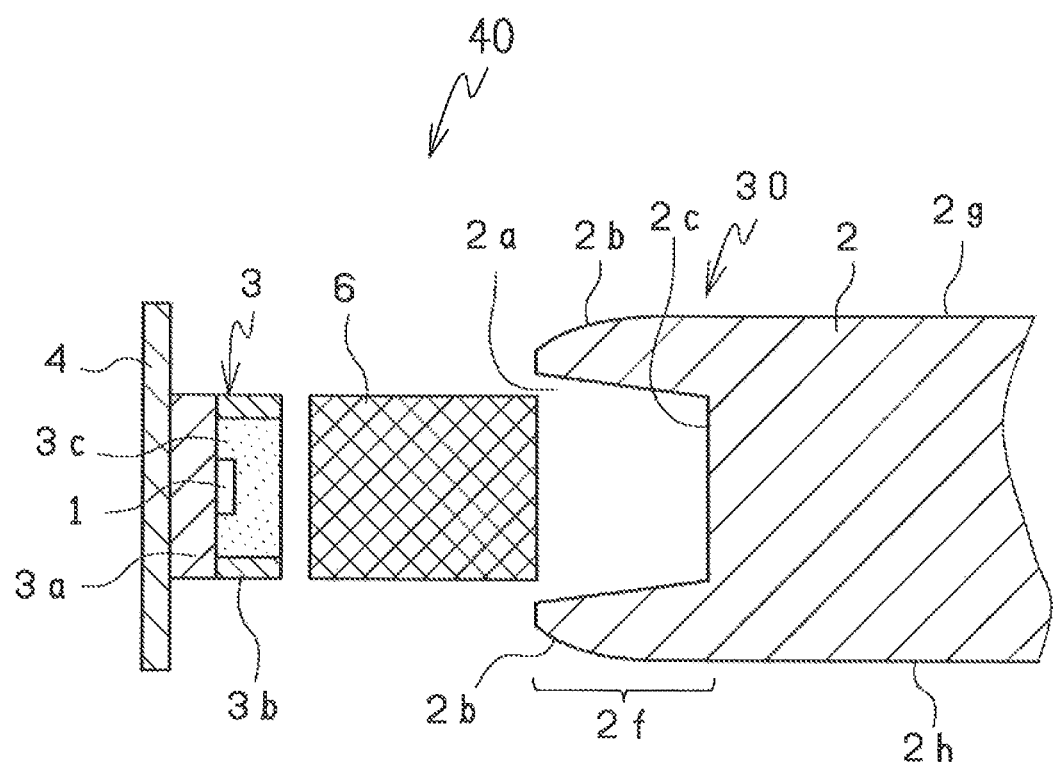
FIG. 1 is a sectional view of exploded main components of a light source included in a planar light unit according to a first embodiment.

Hereinafter, embodiments of the present application will be described in detail with reference to the attached figures. It should be noted that the following embodiments are provided as examples of a planar light unit to embody the concept of the present application, and the present disclosure will not be limited to the configurations below. Particularly, unless otherwise specified, dimensions, materials, shapes, and relative arrangement, and other configurations of components described in the embodiments are not intended to limit the scope of the present application and provided as examples of the description. In the following description, identical components and constituents are assigned identical names and reference numerals, and detailed descriptions may be appropriately omitted.

Throughout the embodiments of the present application, LED light-emitting devices will be described as examples of semiconductor light-emitting devices.

First Embodiment

A planar light unit 40 according to the first embodiment of the present application will be described by referring to FIGS. 1 to 8. FIGS. 1 to 8 illustrate: a light source 30, which is included in the planar light unit 40; a general arrangement in which the light source 30 is mounted; and a display device 50, which uses the planar light unit 40.

Figure 2:
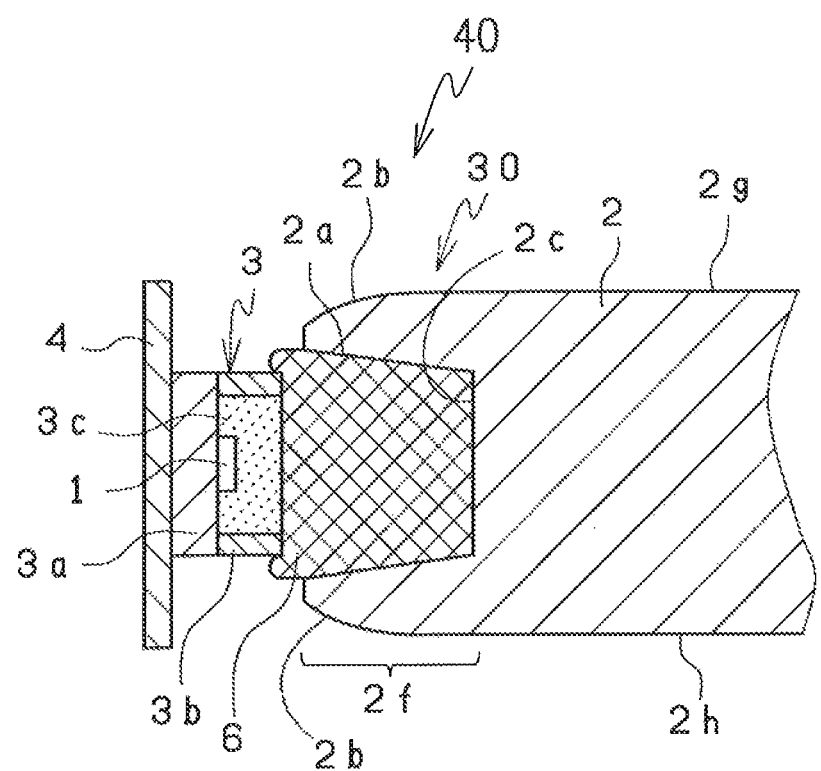
FIG. 2 is a sectional view of the main components of the light source included in the planar light unit according to the first embodiment, with the main components assembled.
Figure 3:
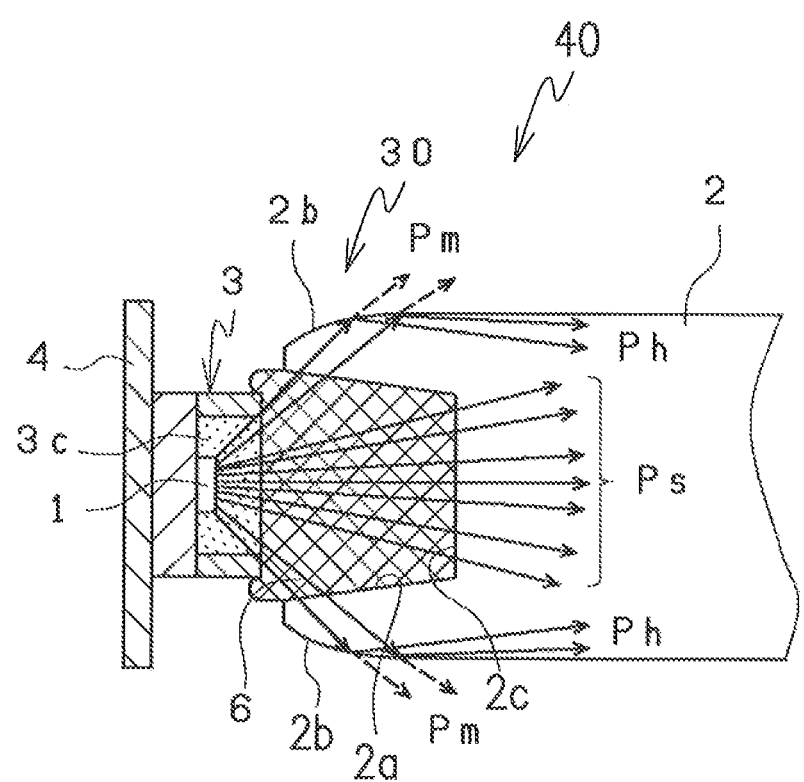
FIG. 3 is a sectional view of the main components of the light source illustrated in FIG. 2, illustrating how light is guided by the light source.
Figure 4:
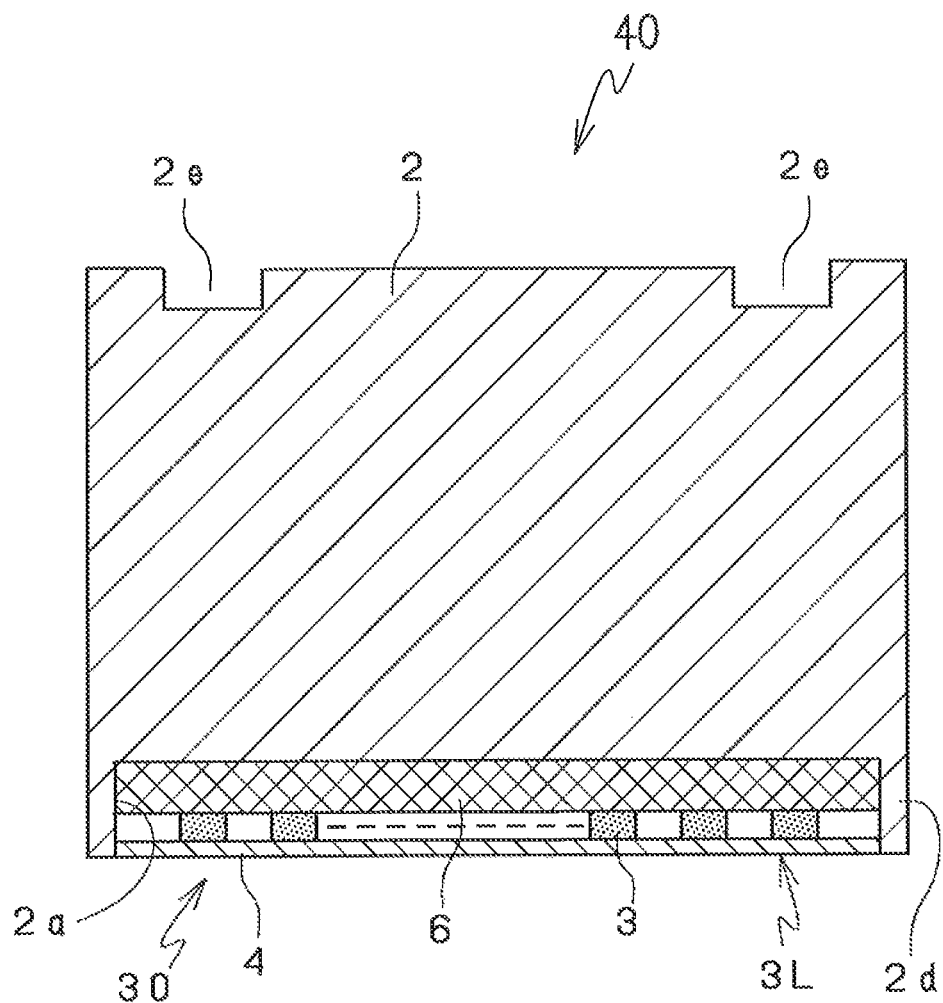
FIG. 4 is a horizontal sectional view of a light guide plate including the entire light source illustrated in FIG. 2.
Figure 5:
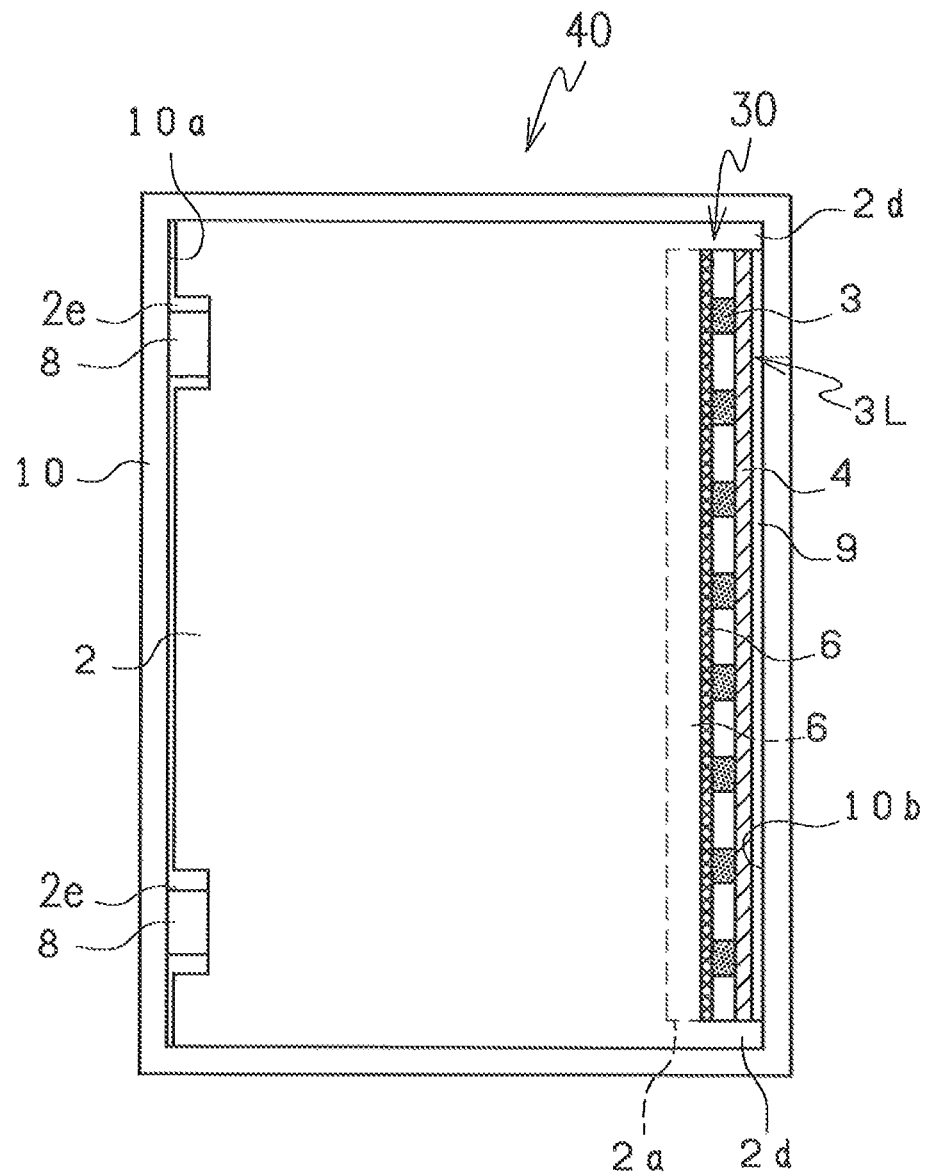
FIG. 5 is a plan view of the planar light unit according to the first embodiment.

FIG. 1 is a sectional view of exploded main components of the light source 30, which is included in the planar light unit 40. FIG. 2 is a sectional view of the main components of the light source 30 with the components illustrated in FIG. 1 assembled. FIG. 3 is a sectional view of the main components of the light source 30, illustrating how light is guided by the light source 30. In FIG. 3, arrows are used to depict light rays entering a light guide plate 2 from an LED die 1 and propagating within the light guide plate 2. FIG. 4 is a horizontal sectional view of the light guide plate 2 including the entire light source 30. FIG. 5 is a plan view of the planar light unit 40 with the light guide plate 2 and a light-emitting unit 3L mounted in a frame 10.

Figure 6:
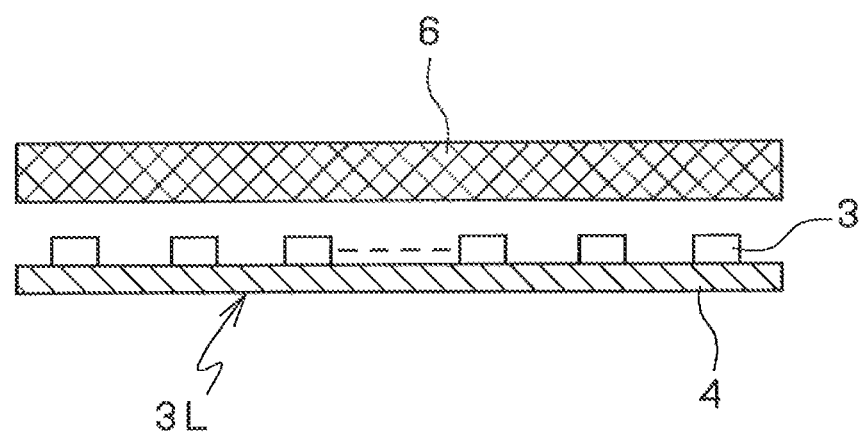
FIG. 6 is a horizontal sectional view of a light-emitting unit and a single continuous flexible resin included in the planar light unit illustrated in FIG. 5.
Figure 7:
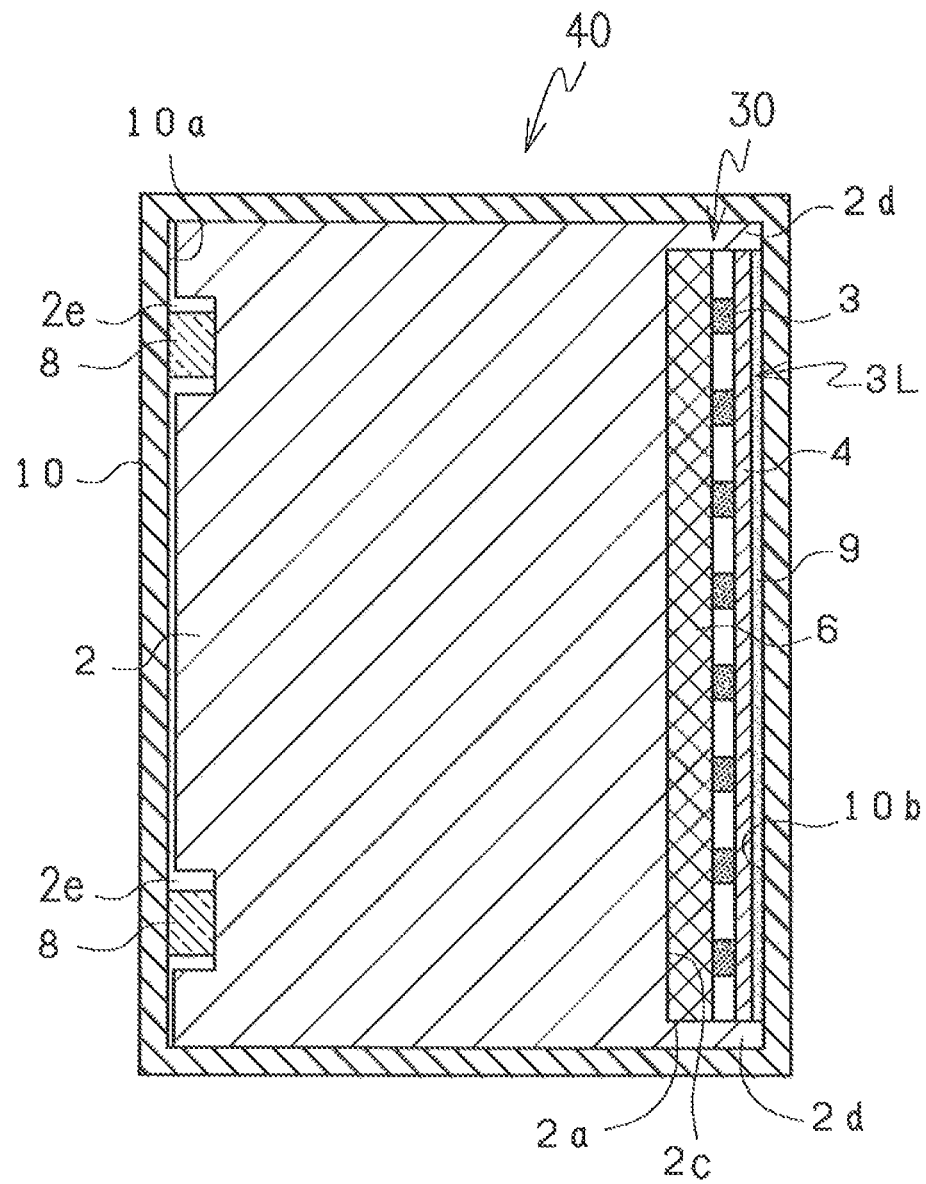
FIG. 7 is a horizontal sectional view of the planar light unit illustrated in FIG. 4.
Figure 8:
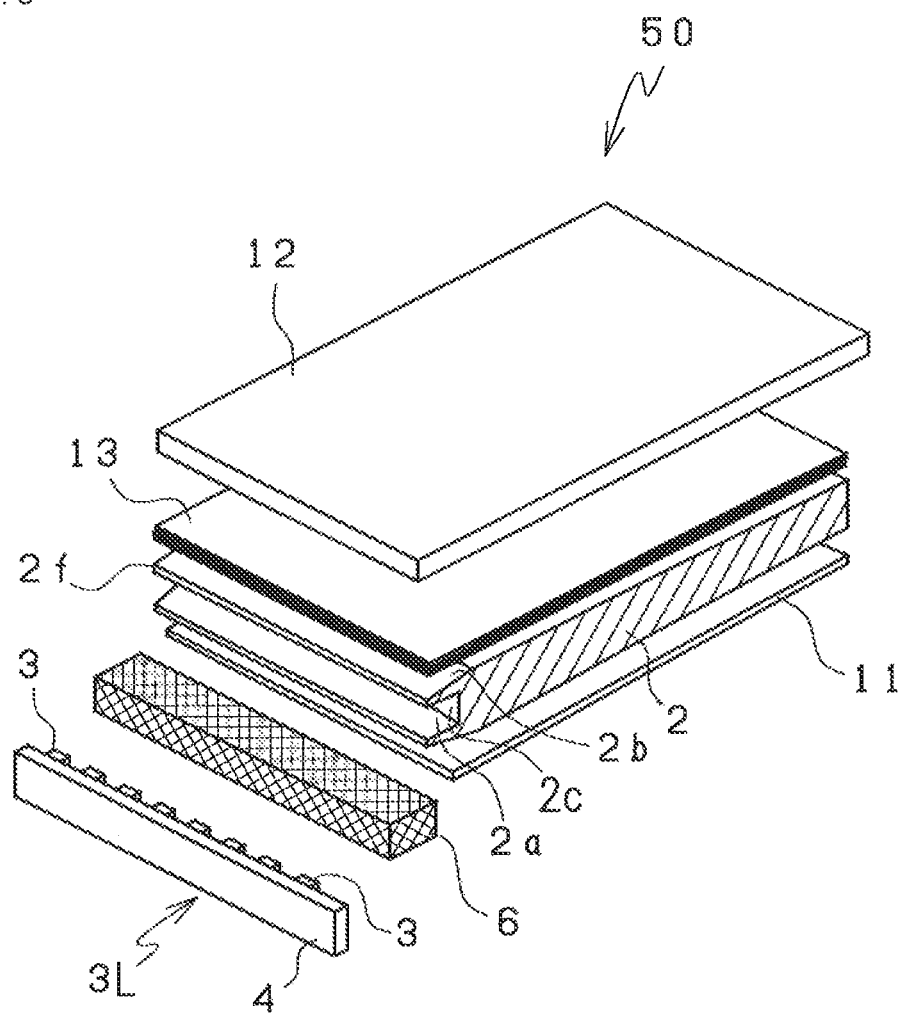
FIG. 8 is an exploded perspective view of a display device using the planar light unit illustrated in FIG. 4.

FIG. 6 is a horizontal sectional view of the light-emitting unit 3L and a flexible resin 6, illustrating their positional relationship. FIG. 7 is a horizontal sectional view of the planar light unit 40. In FIG. 7, a top portion of a recess 2a of the light guide plate 2 is cut off so that the light-emitting unit 3L and the flexible resin 6 can be observed as being mounted in the recess 2a. FIG. 8 is an exploded perspective view of the display device 50, which uses the planar light unit 40.

(Description of Light Source According to First Embodiment, FIGS. 1 to 4)

FIG. 1 is a sectional view of the main components of the light source 30, which is included in the planar light unit 40. In FIG. 1, the components constituting the light source 30 are illustrated in an exploded manner. As illustrated in FIG. 1, the light source 30 includes: a light incident portion 2f, which lies over a side edge of the light guide plate 2; the flexible resin 6; a semiconductor light-emitting device 3; and a light source board 4. The light guide plate 2 includes a light exit surface 2g on a top surface of the light guide plate 2 and a reflective surface 2h on a bottom surface of the light guide plate 2. The left side edge of the light guide plate 2 defines the light incident portion 2f.

The light incident portion 2f includes the recess 2a and reflecting-shaped portions 2b, which define curved surfaces on top and bottom surfaces of the recess 2a. The bottom (a plane perpendicular to the drawing) of the recess 2a is a light incident surface 2c. The semiconductor light-emitting device 3 (hereinafter simply termed as "light-emitting device 3") includes: a module board 3a; the LED die 1, which is mounted on the module board 3a; a sealing resin 3c, which covers the LED die 1; and a reflective resin frame 3b, which surrounds the sealing resin 3c. The light-emitting device 3 is mounted on the light source board 4 and is supplied with power through a wiring electrode, not illustrated. The flexible resin 6, which has a light-transmitting property, is disposed between the recess 2a of the light guide plate 2 and the light-emitting device 3.

It is noted that the light-emitting device 3 is what is called an R, G, B-LED. In an application where the LED die 1 itself emits light in red (R), green (G), or blue (B), the sealing resin 3c may be a transparent resin. In an application where the LED die 1 itself emits light in blue or emits ultraviolet light, the sealing resin 3c is a fluorescent resin mixed with fluorescent particles (excluding a B-LED including a B-emitting LED die).

FIG. 2 is a sectional view of the main components of the light source 30. In FIG. 2, the components illustrated in FIG. 1 are assembled into the light source 30. As illustrated in FIG. 2, in the light source 30, the flexible resin 6 is inserted in the recess 2a of the light guide plate 2, and the light-emitting device 3 is pressed against the left edge of the flexible resin 6. This, as a result, causes the flexible resin 6 to be compressed and deformed to fill the entire recess 2a.

The light guide plate 2 is made of light-transmitting resin such as acrylic, polycarbonate, and silicone. The recess 2a, which has an approximately rectangular cross-section, and the reflecting-shaped portions 2b are formed in the light guide plate 2 by molding. It is noted that the recess 2a has a tapered sectional shape that is slightly wider at the entrance of the recess 2a. This tapered shape facilitates the molding processing and insertion of the flexible resin 6. The recess 2a has flat portions at the top and bottom of the entrance of the recess 2a. These flat portions are formed for restriction reasons on the molding processing. The recess 2a is formed with a depth greater than the depth of the reflecting-shaped portions 2b. Each of the curved shapes of the reflecting-shaped portions 2b is, as seen in their sectional views in FIG. 2, part of an arc or part of a quadratic curve. The reflecting-shaped portions 2b totally reflect the light emitted obliquely upward (or downward) from the light-emitting device 3 and guide the light into the light guide plate 2.

As illustrated in FIG. 1, the depth (width in right-left directions of the drawing) of the flexible resin 6 is greater than the depth (width in the right-left directions of the drawing) of the recess 2a. Under this condition, the flexible resin 6 illustrated in FIG. 2 is compression-deformed between the light incident surface 2c and the light-emitting device 3. This compression-deformation stabilizes the optical and mechanical connection between the light-emitting device 3 and the light guide plate 2. Moreover, the depth of the flexible resin 6 is sufficiently great enough to position the light exit surface of the light-emitting device 3 outside the recess 2a. This eliminates, for example, vibration-caused contact between the light-emitting device 3 and the light guide plate 2.

The compression-deformation of the flexible resin 6 absorbs errors in shape of the components and/or thermal expansion deformation of the components caused by their temperature characteristics. That is, the flexible resin 6, which is interposed between the light guide plate 2 and the light-emitting device 3, is required to have high flexibility. For example, the Young's modulus of the flexible resin 6 may preferably be approximately 0.1 to 1.0 MPa. The flexible resin 6 having a Young's modulus of approximately 0.1 to 1 MPa applies a pressure of approximately 10 MPa to the light-emitting device 3. The light-emitting device 3 is broken by a pressure of approximately 100 MPa. Therefore, the light-emitting device 3 is not broken by the pressure of approximately 10 MPa.

The flexible resin 6 preferably has a refractive index of 1.4 to 1.6. It is well-known that reflection occurs when light passes from a medium having a refractive index of n1 to a medium having a refractive index of n2 (a reduction in the amount of light through reflection will be hereinafter referred to as "Fresnel loss"). A Fresnel loss increases as the difference between the refractive index n1 and the refractive index n2 increases. The refractive indexes of the light guide plate 2 and the sealing resin 3c, which is included in the light-emitting device 3, are approximately 1.5. In light of this, the Fresnel loss is negligible insofar as the refractive index of the flexible resin 6 is set to 1.4 to 1.6.

FIG. 3 is a sectional view of the main components of the light source 30 illustrated in FIG. 2, plus light rays from the light-emitting device 3 entering the light guide plate 2. In FIG. 3, arrows indicate how the light rays travel. As illustrated in FIG. 3, the sealing resin 3c of the light-emitting device 3 and the light incident surface 2c of the light guide plate 2 are in complete contact with each other through the flexible resin 6. Accordingly, light rays Ps of the light rays traveling from the LED die 1 toward the light guide plate 2 are traveling the center and the vicinity of the center of the light incident portion 2f and guided into the inside of the light guide plate 2 with approximately no Fresnel loss.

Light rays Ph, which are traveling diagonally upward (or downward), enter the light guide plate 2 through the side walls of the recess 2a. Then, the light rays Ph are totally reflected off the reflecting-shaped portions 2b and guided into the inside of the light guide plate 2.

Since the light exit surface (sealing resin 3c) of the light-emitting device 3 and the side walls of the recess 2a are in close contact with each other through the flexible resin 6, approximately no Fresnel loss occurs even in the optical paths of the light rays Ph. In this manner, the compressively deformed flexible resin 6 reduces Fresnel loss of the light rays Ps, which are traveling the center and the vicinity of the center of the light incident portion 2f, and the light rays Ph, which are traveling diagonally upward (or downward). If the reflecting-shaped portions 2b are not provided, the light rays Ph would turn into unusable light rays Pm. With the light source 30, however, the reflecting-shaped portions 2b totally reflect the light rays Ph, making the light rays Ph usable. These configurations significantly enhance the optical connection between the light-emitting device 3 and the light guide plate 2 in the light source 30.

FIG. 4 is a horizontal sectional view of the light guide plate 2 including the entire light source 30, in a horizontal direction (in a direction perpendicular to FIG. 3). Specifically, FIG. 4 is a horizontal sectional view of the light guide plate 2 taken along the center of the light guide plate 2 in a thickness direction of the light guide plate 2. In FIG. 4, to facilitate understanding of the structure of the components, the recess 2a of the light guide plate 2 is partially cut off, so that the flexible resin 6 can be observed directly. In a horizontal sectional view of the light guide plate 2, one side wall of the recess 2a, not illustrated, is present at the other side of the flexible resin 6, and is a laterally elongated plate member constituting the lower cut-portion of the light guide plate 2. Two protrusions 2d are observed at both ends of the plate member corresponding to each side wall of the recess 2a. On the side surface of the light guide plate 2 opposite to the recess 2a, two housings 2e are formed for housing elastic support members 8 (see FIG. 5).

The light-emitting unit 3L includes: the light source board 4, which has a rectangular shape; and a plurality of light-emitting devices 3. The light-emitting devices 3 are mounted on the light source board 4 at predetermined intervals. The light exit surfaces of all the light-emitting devices 3 are covered by a single continuous flexible resin 6. It is noted that due to the compression-deformation of the flexible resin 6 as illustrated in FIG. 2, the bottom side of the flexible resin 6, which is fitted in the recess 2a of the light guide plate 2, is recessed at every portion where a light-emitting device 3 exists. In FIG. 4, however, a straight line is used to depict the bottom side of the flexible resin 6 for the sake of description.

(Description of Planar Light Unit According to First Embodiment, FIGS. 5 to 7)

Next, a general arrangement of the planar light unit 40 will be described.

FIG. 5 is a plan view of the planar light unit 40. As illustrated in FIG. 5, the two elastic support members 8 are fixed at predetermined positions on one inner wall 10a of the frame 10, which is made of metal. The light source board 4, which constitutes the light-emitting unit 3L, is adhered to another inner wall 10b, which faces the inner wall 10a, using adhesive tape 9. In this state, the light guided plate 2, the light-emitting unit 3L, and the flexible resin 6 are mounted in the frame 10.

As illustrated in FIG. 4, the two protrusions 2d are disposed on both ends of the recess 2a in the light guide plate 2. The protrusions 2d are abutted against the inner wall 10b of the frame 10 to support the light guide plate 2. In this state, the light guide plate 2 is forced in the right direction of FIG. 5 by the elastic support members 8, which are disposed in the housings 2e. In this manner, the light guide plate 2 is pressed against and fixed within the frame 10. As described above, the light-emitting unit 3L is fixed to the inner wall 10b of the frame 10 with the adhesive tape 9. The light-emitting unit 3L compresses the flexible resin 6 and thus is mechanically connected with the light guide plate 2 through the flexible resin 6 and the recess 2a.

Here, the force exerted on the light-emitting unit 3L is only repulsive force of the flexible resin 6. That is, the force exerted on the light-emitting unit 3L is significantly weaker than the force that the elastic support members 8 press the light guide plate 2 against the frame 10. Therefore, the repulsive force of the flexible resin 6 varies little, even if the components vary in size and/or are deformed due to changes in temperature. As a result, the mechanical connection between the light-emitting unit 3L and the light guide plate 2 is kept stable. It is noted that a dotted line in FIG. 5 indicates an outer shape of the flexible resin 6 housed in the recess 2a, which has a long groove shape, of the light guide plate 2.

FIG. 6 is a horizontal sectional view of the light-emitting unit 3L and the flexible resin 6. As illustrated in FIG. 6, in the light-emitting unit 3L, the light-emitting devices 3 are mounted at regular intervals on a surface of the light source board 4, which has a rectangular plate shape. The flexible resin 6 has a prismatic shape long enough to collectively press the plurality of light-emitting devices 3, which are mounted on the light source board 4.

Next, a configuration of the planar light unit 40 will be described in more detail by referring to FIG. 7.

FIG. 7 is a horizontal sectional view of the planar light unit 40, in which the flexible resin 6 can be directly observed to facilitate understanding of the structure of the components included in the light source 30.

A basic configuration of the planar light unit 40 illustrated in FIG. 7 is as described by referring to FIG. 5. Thus, in FIG. 7, description will focus on an assembly procedure, omitting redundant description.

The procedure for assembling the planar light unit 40 is as follows. First, the elastic support members 8 are adhered to the inner wall 10a of the frame 10. Next, the light source board 4 (light-emitting unit 3L) on which the light-emitting devices 3 are mounted is adhered to the inner wall 10b of the frame 10 with the adhesive tape 9. Next, part of the prismatic flexible resin 6 is embedded in the recess 2a of the light guide plate 2 and, in this state, the light guide plate 2 is fitted into the frame 10. While slightly deforming the light guide plate 2, the light guide plate 2 is being fitted into the frame 10. Specifically, pressure is applied to the elastic support members 8 so as to bend the light guide plate 2, causing the flexible resin 6 to press the light-emitting devices 3.

Simultaneously, the protrusions 2d of the light guide plate 2 are pressed against the inner wall 10b of the frame 10 to fix the light guide plate 2. It is noted that when the protrusions 2d are pressed against the inner wall 10b of the frame 10, approximately all of the pressure force exerted by the elastic support members 8 is transmitted to the frame 10. As described above, the force that the light-emitting unit 3L exerts to push back the light guide plate 2 through the flexible resin 6 is significantly weaker than the force that the frame 10 exerts to push back the light guide plate 2 through the protrusions 2d.

The protrusions 2d are disposed on both sides of the recess 2a so as to accurately position and fix the light guide plate 2 and the light source 30 to the frame 10. The length of the protrusions 2d (in right-left directions of FIG. 7) is slightly smaller than a sum of the height of the light-emitting unit 3L (in the right-left directions of FIG. 7) and the height of the flexible resin 6 (in the right-left directions of FIG. 7). This configuration is for the purpose of providing a compression allowance for the flexible resin 6 between the light-emitting unit 3L and the light incident surface 2c of the light guide plate 2. The compression allowance for the flexible resin 6 prevents the light-emitting device 3 from being damaged, and absorbs processing errors of the light guide plate 2 and the light-emitting device 3 and/or absorbs thermal-expansion dimensional changes in the light guide plate 2 and the light-emitting device 3.

As a result, the planar light unit 40 can be mass produced without defects caused by these factors. It is noted that when the length of the light guide plate 2 (in the right-left directions of FIG. 7) is changed due to a change in temperature, the change is observed over the entire length of the light guide plate 2, whereas a change in the length of the light source 30 (in the right-left directions of FIG. 7) is observed only over the length of the protrusions 2d (in the right-left directions of FIG. 7). That is, with the planar light unit 40, even when the light guide plate 2 thermally expands and deforms due to a change in temperature, the light source 30 deforms within the range over which the protrusions 2d deform. This ensures reduced influence of temperature changes.

(Description of Display Device with Planar Light Unit According to First Embodiment, FIG. 8)

Next, the display device including the planar light unit illustrated in FIG. 8 will be described.

FIG. 8 is an exploded perspective view of the display device 50, which includes the planar light unit 40. It is noted that in FIG. 8, the frame 10 and the protrusions 2d are not illustrated so that the inside of the planar light unit 40 is more visible.

As illustrated in FIG. 8, the prismatic flexible resin 6 is fitted into the recess 2a of the light guide plate 2 and pressed by the plurality of light-emitting devices 3 of the light-emitting unit 3L. On the bottom surface of the light guide plate 2, a reflective sheet 11 is disposed. The reflective sheet 11 is made of a highly reflective metal plate or a resin film printed with reflective ink containing diffusing agent such as silicon oxide. The reflective sheet 11 reflects light that has leaked from the light guide plate 2 to return the light toward the light exit surface of the light guide plate 2. A liquid crystal cell 12 is disposed on the top surface side (light exit surface side) of the planar light unit 40. If deemed necessary, an optical sheet 13 is disposed between the light guide plate 2 and the liquid crystal cell 12. Examples of the optical sheet 13 include: a reflective polarizing film for increasing polarization components guided to the liquid crystal cell 12; a diffusing film for diffusing illumination light; and a prism sheet for controlling directivity to improve brightness.

(Effects of Display Device with Planar Light Unit According to First Embodiment)

In the planar light unit 40, the light guide plate 2 includes the recess 2a and the reflecting-shaped portions 2b so as to optically and mechanically connect the light-emitting devices 3 and the light guide plate 2 to each other through the flexible resin 6. The flexible resin 6 is compressed between the light-emitting devices 3 and the light guide plate 2, eliminating presence of an air layer between the light-emitting devices 3 and the light guide plate 2. As a result, the planar light unit 40 improves in brightness by approximately 25% compared with a planar light unit that causes light emitted from light-emitting devices to enter a flat light incident surface of a light guide plate through an air layer.

Moreover, there is a problem with the planar light unit that causes light emitted from the light-emitting devices to enter the flat light incident surface of the light guide plate through the air layer; when the sealing resin of the light-emitting devices contains a fluorescent substance, it is difficult to control chromaticity of exiting light. For example, when the color of light emitted from the light-emitting device is $x=0.2785\pm0.0045$, $y=0.2565\pm0.0185$ (x and y are coordinates on the CIE chromaticity diagram), the color of light emitted from the planar light unit is $x=0.3061\pm0.019$, $y=0.3010\pm0.0027$. That is, the color of light emitted from the planar light unit is shifted to a longer wavelength (yellowed) than the wavelength of the color of light emitted from the light-emitting device. This results in a further increase in the range of the color of light emitted from the planar light unit.

This phenomenon will be described by referring to a case where the light-emitting device includes a blue LED die and the resin for sealing the blue LED die contains a yellow fluorescent substance. In the above-described planar light unit, there is an air layer between the light-emitting device and the light guide plate. When blue light is emitted from the blue LED die included in the light-emitting device, part of the blue light that has not been wavelength-converted by the sealing resin is reflected off the boundary between the sealing resin and the air. This blue light returns to the sealing resin, and a certain proportion of the blue light is wavelength-converted by the fluorescent resin contained in the sealing resin. Similarly, the blue light, which is reflected between the air layer and the light incident surface of the light guide plate and returned to the sealing resin, is also wavelength-converted. That is, in this planar light unit, reflection of blue light at the boundaries of the air layer causes a decrease in blue components of the blue light while increasing long wavelength components of the blue light. Consequently, the color of light emitted from the planar light unit shifts to a longer wavelength than the wavelength of the color of light measured at the LED alone. Moreover, it is difficult to control the amount of reflection, leading to an increase in the range of variation such as the shift amount.

By contrast, the planar light unit 40 includes the flexible resin 6 between the light-emitting devices 3 and the light incident surface 2c of the light guide plate 2. This makes the light-emitting devices 3 and the light incident surface 2c in optically close contact with each other, resulting in approximately no reflection occurring at the boundary. As a result, in the planar light unit 40, the color of light emitted from the light-emitting devices 3 is approximately identical to the color of light emitted from the planar light unit 40. This color of light is, however, based on the assumption that there is no difference in refractive index between the light-emitting devices 3 and a sensor of a measurement device. In practice, the color of light emitted from the light-emitting devices 3 is measured in air. Thus, as described above, the light emitted from the light-emitting devices 3 is reflected at the light emission surfaces, causing the color of the light to shift to a longer wavelength than the wavelength of the above-described virtual color of light.

In light of the circumstances, the actual color of light emitted from the light-emitting devices 3 is set to a longer wavelength than the wavelength of the target color of light to be emitted from the planar light unit 40. For example, when the chromaticity coordinate of the target color of light, is X0, the chromaticity coordinate of the light-emitting devices 3 is set to X0+(0.02 to 0.05). It is noted that even if the flexible resin 6 is interposed between the light-emitting devices 3 and the light guide plate 2, the y coordinate does not greatly fluctuate, compared with the x coordinate.

The planar light unit 40 employs elastomer (silicone resin) as the flexible resin 6. Elastomer has a low degree of polymerization and, as such, an unpolymerized silicone resin may ooze out. In light of the circumstances, in the planar light unit 40, the elastomer is disposed in the recess 2a, which is formed in the light incident portion 2f. In other words, much of the oozed silicone resin remains in the recess 2a. As a result, the resin oozing out from the elastomer has less influence on other components, which is a characteristic of the planar light unit 40.

Second Embodiment

Next, a light source 31, which is included in a planar light unit 42 according to the second embodiment of the present application, will be described by referring to FIG. 9.

Figure 9:
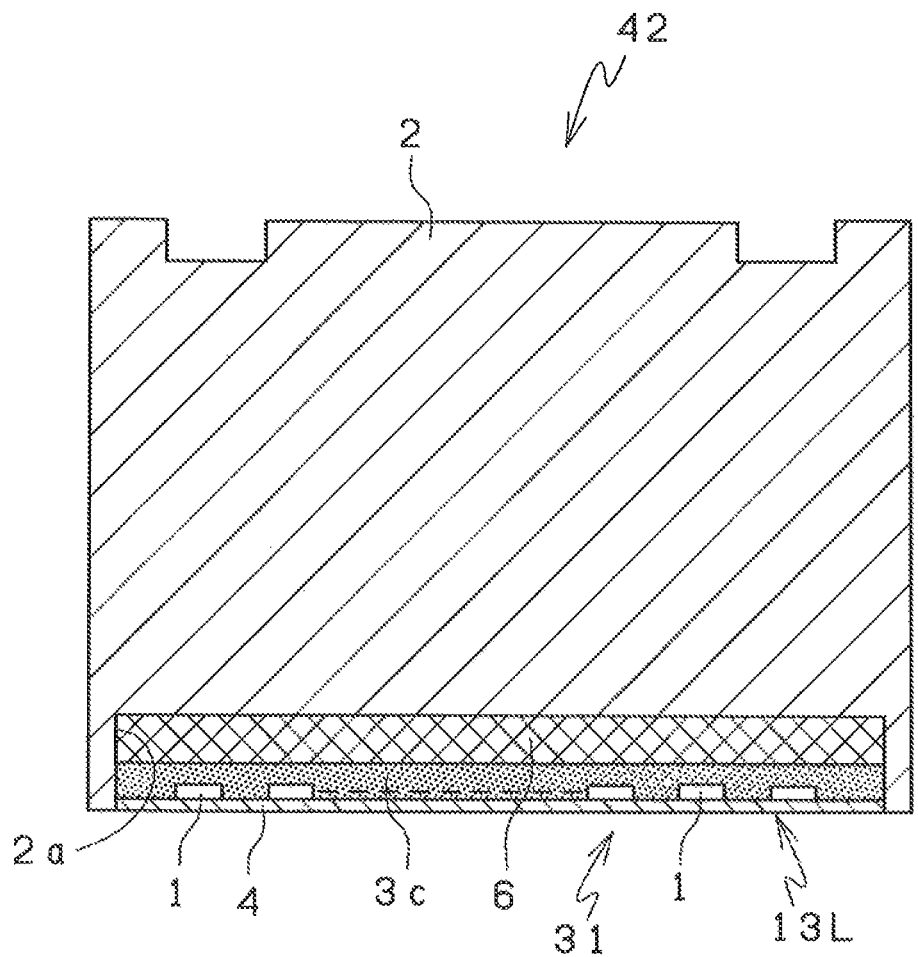
FIG. 9 is a horizontal sectional view of a planar light unit according to a second embodiment.

FIG. 9 is a horizontal sectional view of the light guide plate 2, which includes the light source 31, in the planar light unit 42. The sectional structure of the planar light unit 42 illustrated in FIG. 9 is basically the same as the sectional structure of the planar light unit 40 illustrated in FIG. 4. Thus, like reference numerals designate identical components, and redundant descriptions will be omitted. Similarly to FIG. 4, a top portion of the recess 2a is also cut off in FIG. 9, so that how a light-emitting unit 13L and the flexible resin 6 are connected to each other can be viewed clearly.

The horizontal section illustrated in FIG. 9 is different from the horizontal section illustrated in FIG. 4 only in the structure of the light-emitting unit 13L. In the light-emitting unit 3L, which is included in the planar light unit 40, the plurality of light-emitting devices 3 are mounted on the light source board 4 at predetermined intervals (see FIG. 4). By contrast, in the light-emitting unit 13L, which is included in the planar light unit 42, the plurality of LED dies 1 are, as illustrated in FIG. 9, mounted on the light source board 4 at predetermined intervals, and these plurality of LED dies 1 are collectively sealed by the sealing resin 3c. That is, the light-emitting devices and the light source board 4 are integral to each other in the planar light unit 42.

In the planar light unit 42, the surface of the sealing resin 3c, which constitutes the light-emitting unit 13L, abuts against the flexible resin 6, which is inserted in the recess 2a of the light guide plate 2, throughout the width of the flexible resin 6. This configuration increases the stability of the optical and mechanical connection between the light-emitting unit 13L and the flexible resin 6, compared with the planar light unit 40.

Third Embodiment

Next, a light source 32, which is included in a planar light unit 43 according to the third embodiment of the present application, will be described by referring to FIG. 10.

Figure 10:
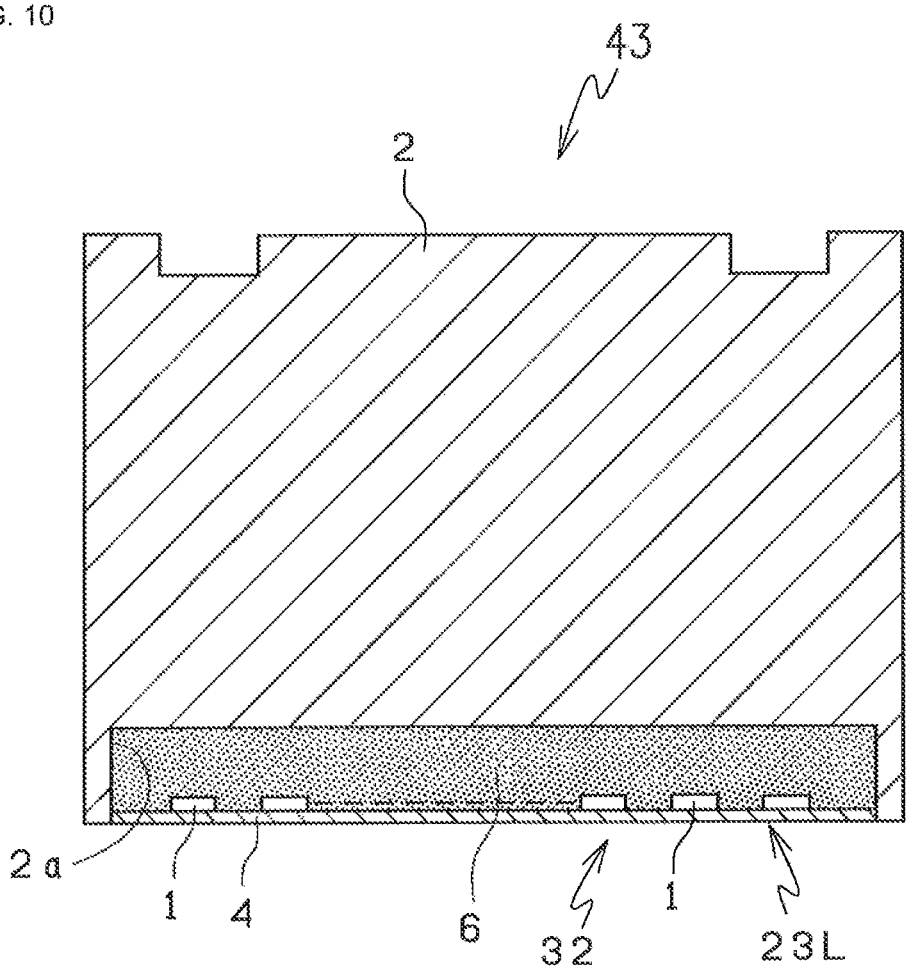
FIG. 10 is a horizontal sectional view of a planar light unit according to a third embodiment.

FIG. 10 is a horizontal sectional view of the light guide plate 2, which includes the light source 32, in the planar light unit 43. The sectional structure of the planar light unit 43 illustrated in FIG. 10 is basically the same as the sectional structure of the planar light unit 42 illustrated in FIG. 9. Thus, like reference numerals designate identical components, and redundant descriptions will be omitted. The horizontal section illustrated in FIG. 10 is different from the horizontal section illustrated in FIG. 9 only in the structure of a light-emitting unit 23L. In the light-emitting unit 13L, which is included in the planar light unit 42, the plurality of LED dies 1 are mounted on the light source board 4 at predetermined intervals, and these plurality of LED dies 1 are collectively sealed by the sealing resin 3c (see FIG. 9). By contrast, in the light-emitting unit 23L, which is included in the planar light unit 43, the plurality of LED dies 1 are mounted on the light source board 4 at predetermined intervals, and the plurality of LED dies 1 are collectively sealed by the flexible resin 6. That is, the LED dies 1, the light source board 4, and the flexible resin 6 are integral to each other in the planar light unit 43.

It is noted that the planar light unit 43 may employ either the LED dies 1 or the light-emitting devices 3 as illuminants. In an application where the illuminants are the light-emitting devices 3, a transparent resin is employed as the flexible resin 6. In an application where the illuminants are the LED dies 1, it is preferable to employ, as the flexible resin 6, a fluorescent resin mixed with fluorescent particles, or provide phosphor layers over the light emission surfaces of the LED dies 1. In the planar light unit 43, the flexible resin 6 and the sealing resin are not separated from each other, but integral to each other in the light-emitting unit 23L. This reduces the piece-part count and facilitates assembly of parts.

Fourth Embodiment

Next, a light source 33, which is included in a planar light unit 44 according to the fourth embodiment of the present application, will be described by referring to FIG. 11.

Figure 11:
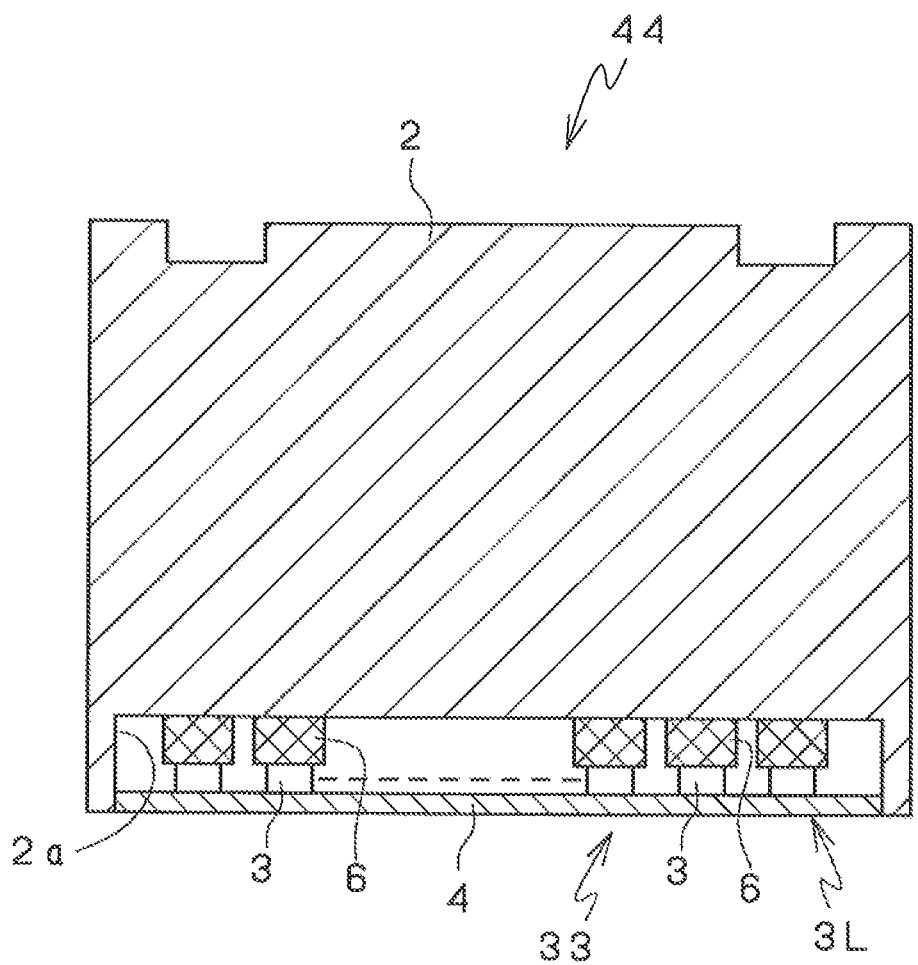
FIG. 11 is a horizontal sectional view of a planar light unit according to a fourth embodiment.

FIG. 11 is a horizontal sectional view of the light guide plate 2, which includes the light source 33, in the planar light unit 44. The sectional structure of the planar light unit 44 illustrated in FIG. 11 is basically the same as the sectional structure of the planar light unit 40 illustrated in FIG. 4. Thus, like reference numerals designate identical components, and redundant descriptions will be omitted.

The horizontal section illustrated in FIG. 11 is different from the horizontal section illustrated in FIG. 4 only in the structure of the flexible resin 6. In the planar light unit 40, one long prismatic flexible resin 6 is disposed to cover all of the plurality of light-emitting devices 3 (see FIG. 4). By contrast, in the planar light unit 44, the flexible resin 6 includes a plurality of separate flexible resins 6, and each flexible resin 6 is disposed at each of the plurality of light-emitting devices 3, which are mounted on the light source board 4. Thus, the planar light unit 44 reduces the amount of flexible resin 6. Moreover, the planar light unit 44 reduces the amount of light that is emitted from the light-emitting devices 3 and that leaks from the inside of the flexible resins 6 in right-left directions of the drawing.

Fifth Embodiment

Next, a light source 34, which is included in a planar light unit 45 according to the fifth embodiment of the present application, will be described by referring to FIG. 12.

Figure 12:
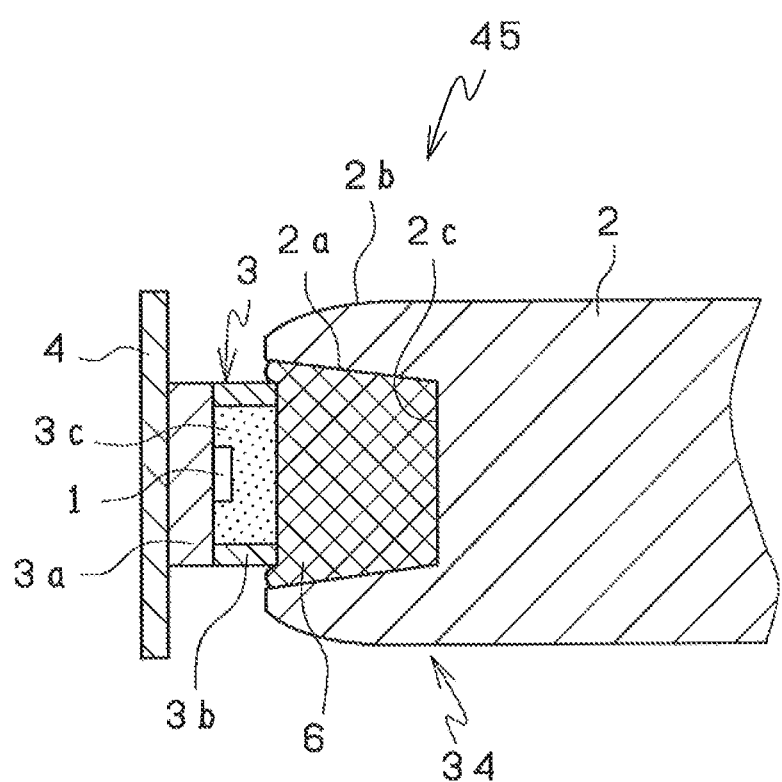
FIG. 12 is a sectional view of main components of a light source of a planar light unit according to a fifth embodiment.

FIG. 12 is a sectional view of main components of the light source 34, which is included in the planar light unit 45. The sectional structure of the light source 34 illustrated in FIG. 12 is basically the same as the sectional structure of the light source 30 illustrated in FIG. 2. Thus, like reference numerals designate identical components, and redundant descriptions will be omitted.

The light source 34 of the planar light unit 45 is different from the light source 30 of the planar light unit 40 only in the position of the light-emitting device 3 with respect to the light guide plate 2. Specifically, in the planar light unit 40, the leading end of the light-emitting device 3 is positioned outside the recess 2a of the light guide plate 2 (see FIG. 2). By contrast, in the planar light unit 45, the leading end of the light-emitting device 3 is positioned inside the recess 2a of the light guide plate 2. This structure makes the light source 34 slightly smaller in size than the light source 30. Moreover, this structure reduces the distance between the leading end of the light-emitting device 3 and the light incident surface 2c of the light guide plate 2. As a result, the optical connection between the light-emitting device 3 and the light guide plate 2 is improved.

Sixth Embodiment

Next, a light source 35, which is included in a planar light unit 46 according to the sixth embodiment of the present application, will be described by referring to FIG. 13.

Figure 13:
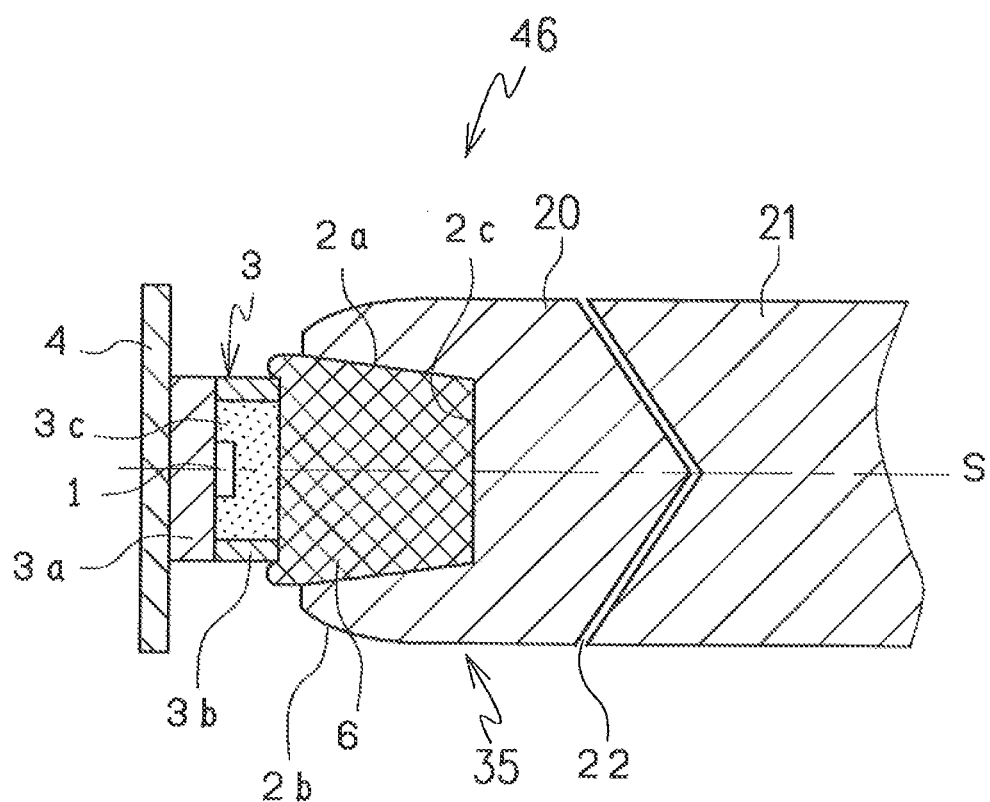
FIG. 13 is a sectional view of main components of a light source of a planar light unit according to a sixth embodiment.

FIG. 13 is a sectional view of main components of the light source 35, which is included in the planar light unit 46. The sectional structure of the light source 35 illustrated in FIG. 13 is basically the same as the sectional structure of the light source 30 illustrated in FIG. 2. Thus, like reference numerals designate identical components, and redundant descriptions will be omitted.

The planar light unit 46 is different from the planar light unit 40 only in the structure of the light guide plate. Specifically, in the planar light unit 40, the light guide plate 2 is an integral body (see FIG. 2). By contrast, in the planar light unit 46, the light guide plate has a two-body structure made up of a front light guide plate 20 and a rear light guide plate 21. The front light guide plate 20 and the rear light guide plate 21 are separated from each other at cutting surfaces having a wedge-shaped cross-section. These cutting surfaces are adhered to each other with a transparent adhesive, so that the front light guide plate 20 and the rear light guide plate 21 are optically connected to and integral to each other.

In terms of ease of assembly of the light source 35, the above-described structure is advantageous. Specifically, some difficulty is involved in positioning and inserting the flexible resin 6, which has an elongated prismatic shape, in the recess 2a, which has an elongated shape and is formed in the light incident portion 2f of the light guide plate 2 of the planar light unit 40. In the planar light unit 46, the light guide plate has a two-body structure made up of the front light guide plate 20 and the rear light guide plate 21. This makes the front light guide plate 20 smaller in size, making handling of the light guide plate easier. Moreover, in the planar light unit 46, the connection portion of the front light guide plate 20 and the rear light guide plate 21 has a wedge-shaped cross-section. This prevents the optical axis from shifting in connecting the front light guide plate 20 and the rear light guide plate 21 to each other.

Seventh Embodiment

A planar light unit 47 according to the seventh embodiment of the present application will be described by referring to FIGS. 14 to 17.

Figure 14:
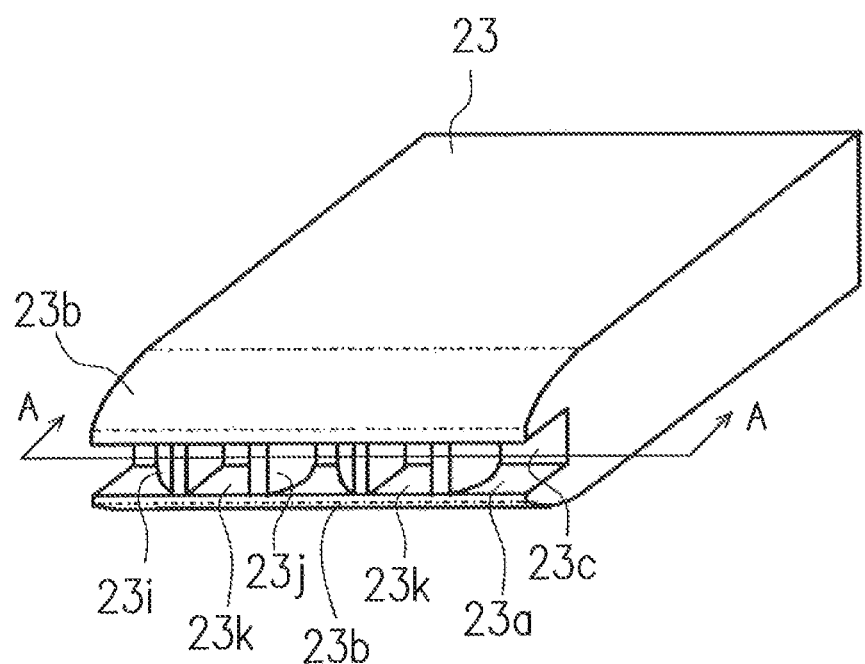
FIG. 14 is a perspective view of a light guide plate of a planar light unit according to a seventh embodiment.
Figure 15:
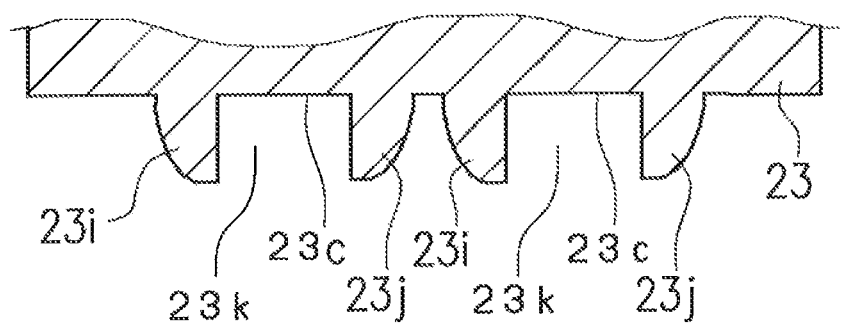
FIG. 15 is a horizontal sectional view of main components of the light guide plate, taken along the line A-A of FIG. 14.
Figure 16:
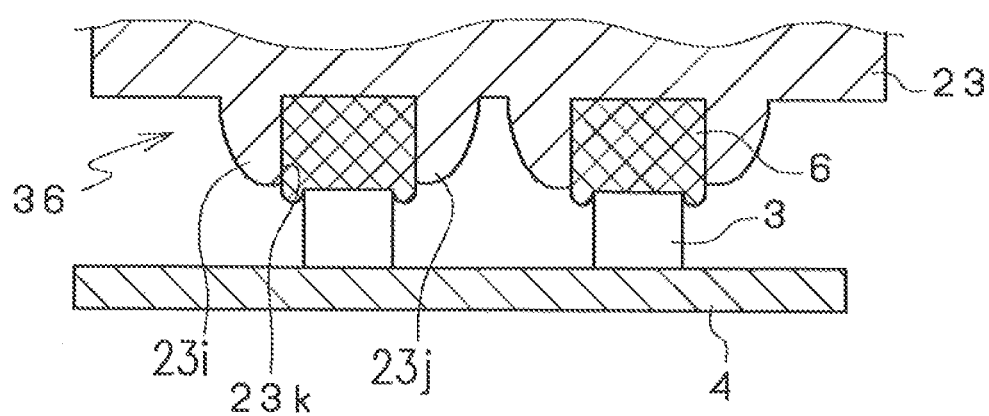
FIG. 16 is a horizontal sectional view of main components of a light source with light-emitting devices and flexible resins mounted in the light guide plate illustrated in FIG. 15.
Figure 17:
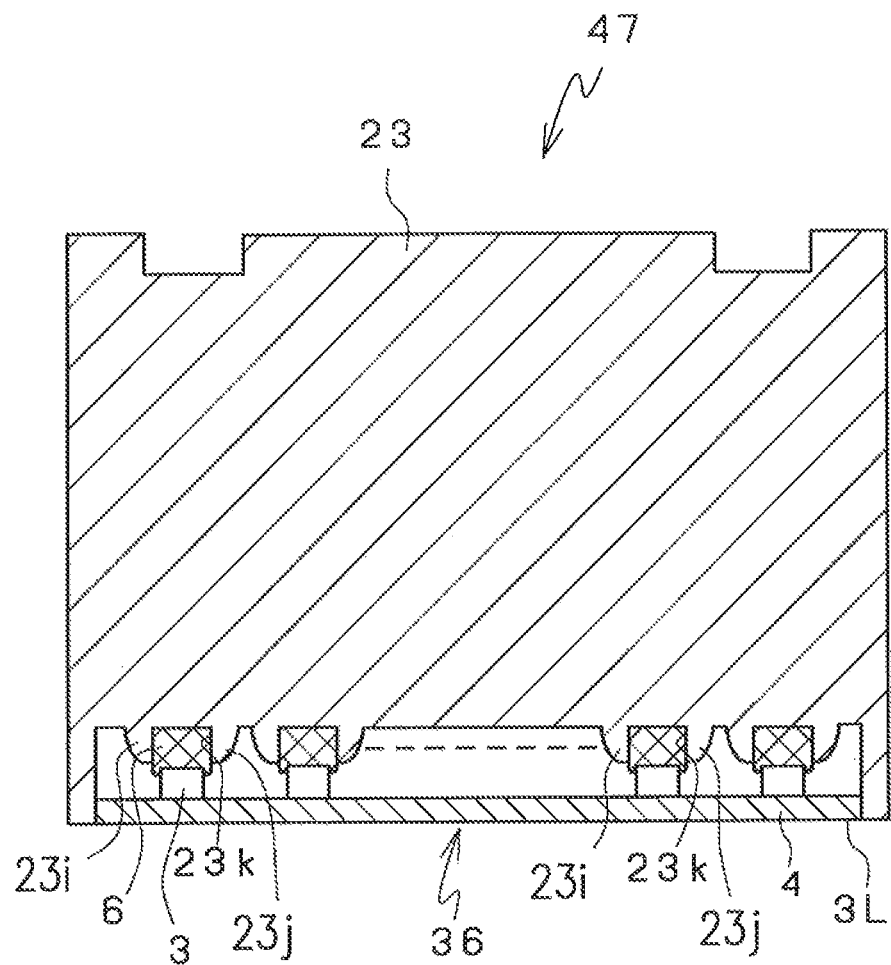
FIG. 17 is a horizontal sectional view of the planar light unit according to the seventh embodiment.

FIG. 14 is a perspective view of a light guide plate 23, which is included in the planar light unit 47, FIG. 15 is a horizontal sectional view of the light guide plate 23, taken along the line A-A of FIG. 14. FIG. 16 is a horizontal sectional view of main components of a light source 36 with the flexible resins 6 and the light-emitting devices 3 mounted in the light guide plate 23 illustrated in FIG. 15. FIG. 17 is a horizontal sectional view of the light guide plate 23 including the entire light source 36.

(Description of Light Source According to Seventh Embodiment, FIGS. 14 to 17)

FIG. 14 is a perspective view of the light guide plate 23, which is included in the planar light unit 47. The light guide plate 23 of the planar light unit 47 illustrated in FIG. 14 has basically the same structure as the light guide plate 2 of the planar light unit 40 illustrated in FIG. 1. Thus, like reference numerals designate identical components, and redundant descriptions will be omitted.

The light guide plate 23 is different from the light guide plate 2 in the structure of a recess 23a, which is formed in the light incident portion of the light guide plate 23. In the light guide plate 2, the recess 2a has a long groove shape having a rectangular cross-section (see FIG. 1). By contrast, a plurality of individual housings 23k are disposed at predetermined intervals inside the recess 23a of the light guide plate 23. Each of the plurality of individual housings 23k includes a pair of side reflective portions 23i and 23j. It is noted that although the recess 23a includes multiple individual housings 23k, FIG. 14 illustrates only two of these individual housings 23k and does not illustrate the protrusions (see FIG. 17) disposed on both ends of the recess 23a.

As illustrated in FIG. 15, the pair of side reflective portions 23i and 23j have vertical inner surfaces and curved outer surfaces. Each individual housing 23k is defined by the vertical surfaces of the pair of side reflective portions 23i and 23j, which face each other, and a light incident surface 23c.

Next, a configuration and operation of the light source 36 will be described by referring to FIG. 16.

FIG. 16 is a horizontal sectional view of the main components of the light source 36 with the flexible resins 6 and the light-emitting devices 3 mounted in the light guide plate 23. As illustrated in FIG. 16, each flexible resin 6 is disposed in each of the individual housings 23k of the light guide plate 23. The light-emitting devices 3, which are mounted on the light source board 4, abut against the flexible resins 6, pressing the flexible resins 6 against the light incident surface 23c of the light guide plate 23.

In this state, the light that has passed through the flexible resins 6 and travels toward the top surface or the bottom surface of the light guide plate 23 (in a direction perpendicular to the drawing) is totally reflected off reflecting-shaped portions 23b (see FIG. 14), which are formed on the top and bottom surfaces of the light guide plate 23, and propagates within the light guide plate 23. The light emitted through right and left side surfaces of the flexible resins 6 and traveling in right-left directions of the drawing is totally reflected off the curved surfaces formed on the outside of the side reflective portions 23i and 23j, and travels in a longitudinal direction of the light guide plate 23.

FIG. 17 is a horizontal sectional view of the light guide plate 23 including the entire light source 36 (a horizontal sectional view taken along the center of the light guide plate 23 in the thickness direction of the light guide plate 23). To facilitate understanding of the structure of the components, the flexible resins 6, which are housed in the recess 23a of the light guide plate 23, can be viewed directly. It is noted that although FIGS. 14 to 16 illustrate only two individual housings 23k for the sake of description, FIG. 17 illustrates multiple individual housings 23k as an actual structure. As illustrated in FIG. 17, the light guide plate 23 includes the plurality of individual housings 23k, which are spaces each sandwiched between the pair of side reflective portions 23i and 23j. Each flexible resin 6 is disposed in each of the individual housings 23k. The light-emitting unit 3L, which includes the rectangular, plate-shaped light source board 4 and the plurality of light-emitting devices 3, is mounted on the lower side of the light guide plate 23. This causes each light-emitting device 3 to abut against and press each flexible resin 6.

With the structure described above, the planar light unit 47 ensures that light traveling in the top-bottom directions and the right-left directions through the flexible resin 6, which is disposed in each individual housing 23k, is supplied to the light guide plate 23 as usable light. That is, the planar light unit 47 makes effective use of not only the light that would otherwise leak in the top-bottom directions, but also the light that would otherwise deviate in the right-left directions, resulting in further improved light-exiting efficiency.

Eighth Embodiment

Next, a light source 37 of a planar light unit 48 according to the eighth embodiment of the present application will be described by referring to FIGS. 18 and 19.

Figure 18:
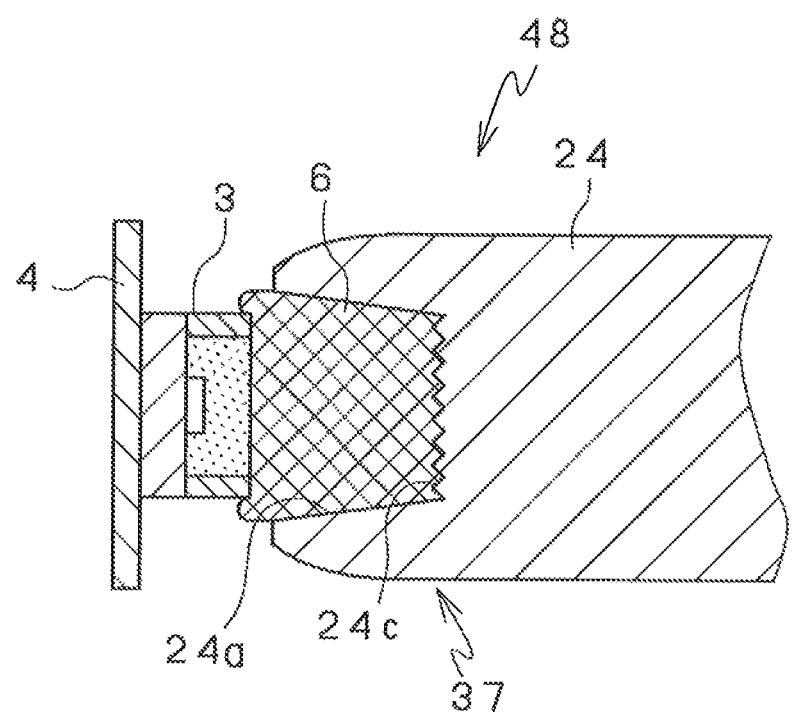
FIG. 18 is a sectional view of main components of a light source of a planar light unit according to an eighth embodiment.

FIG. 18 is a sectional view of main components of the light source 37, which is included in the planar light unit 48. The sectional structure of the light source 37 illustrated in FIG. 18 is basically the same as the sectional structure of the light source 30 illustrated in FIG. 2. Thus, like reference numerals designate identical components, and redundant descriptions will be omitted.

The light source 37 of the planar light unit 48 is different from the light source 30 of the planar light unit 40 in the shape of a light guide plate 24. In the planar light unit 40, the shape of the light incident surface 2c of the light guide plate 2 is flat (see FIG. 1). By contrast, in the planar light unit 48, a light incident surface 24c of the light guide plate 24 has an uneven shape. As a result, the flexible resin 6, which is disposed in a recess 24a of the light guide plate 24, deforms to fit the uneven shape of the light incident surface 24c of the light guide plate 24.

Figure 19:
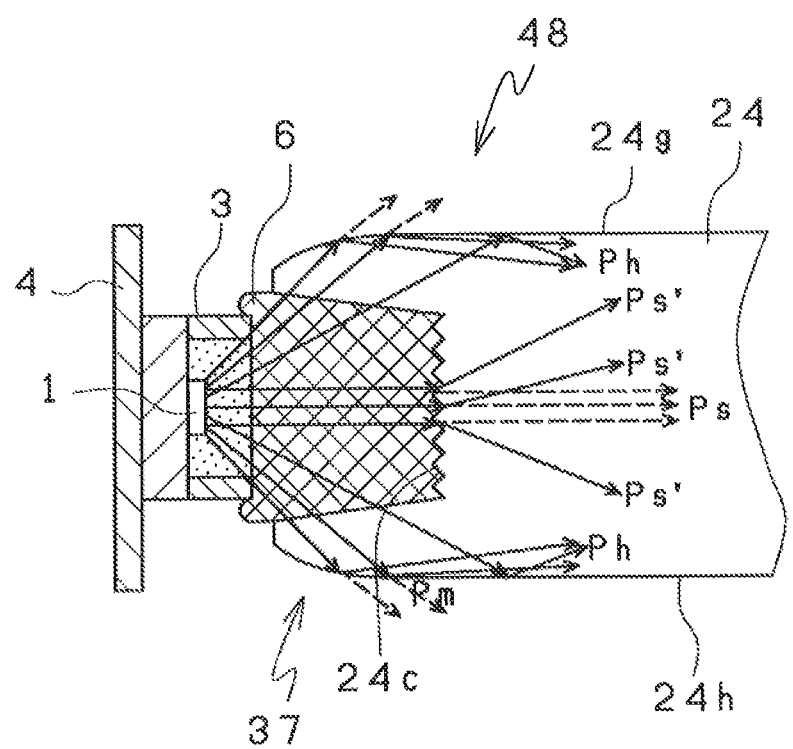
FIG. 19 is a sectional view of the main components of the light source illustrated in FIG. 18, illustrating how light is guided by the light source.

FIG. 19 is a sectional view of the main components of the light source 37 illustrated in FIG. 18, plus light rays (arrows) from the light-emitting device 3 entering the light guide plate 24.

As described above, in the planar light unit 40, the light incident surface 2c in the light source 30 is flat (see FIG. 2). Assume that the light incident surface 24c is flat. In this case, light rays Ps (dotted lines), which are emitted from the LED die 1, travel straight parallel to a light exit surface 24g of the light guide plate 24. Then, the light rays Ps travel straight inside the light guide plate 24 and reach a side surface (not illustrated) of the light guide plate 24 opposite to the light incident surface 24c. The light rays being reflected off this opposite side surface and returning to the light incident surface 24c disappear while the light rays are repeatedly reflected between the light incident surface 24c and the opposite side surface. In other words, if the light incident surface 24c were flat, the light rays Ps, which are a relatively large amount of light rays, would not exit through the light exit surface 24g as usable light. This would, therefore, result in decreased light-exiting efficiency.

By contrast, in the planar light unit 48, the light incident surface 24c has an uneven shape. Thus, the light rays Ps, which are emitted from the LED die 1 and would otherwise travel straight parallel to the light exit surface 24g, diffuse at the uneven-shaped light incident surface 24c, turning into light rays Ps'. The light rays Ps' propagate within the light guide plate 24 while being totally reflected off the light exit surface 24g and a reflective surface 24h. Reflection dots (not illustrated) formed on the reflective surface 24h cause the light rays Ps' to change their propagation directions and to exit through the light exit surface 24g as usable light. In this manner, the light rays Ps are converted into the usable light rays Ps', resulting in improved light-exiting efficiency of the planar light unit 48.

Ninth Embodiment

Next, a light source 38 of a planar light unit 49 according to the ninth embodiment of the present application will be described by referring to FIG. 20.

Figure 20:
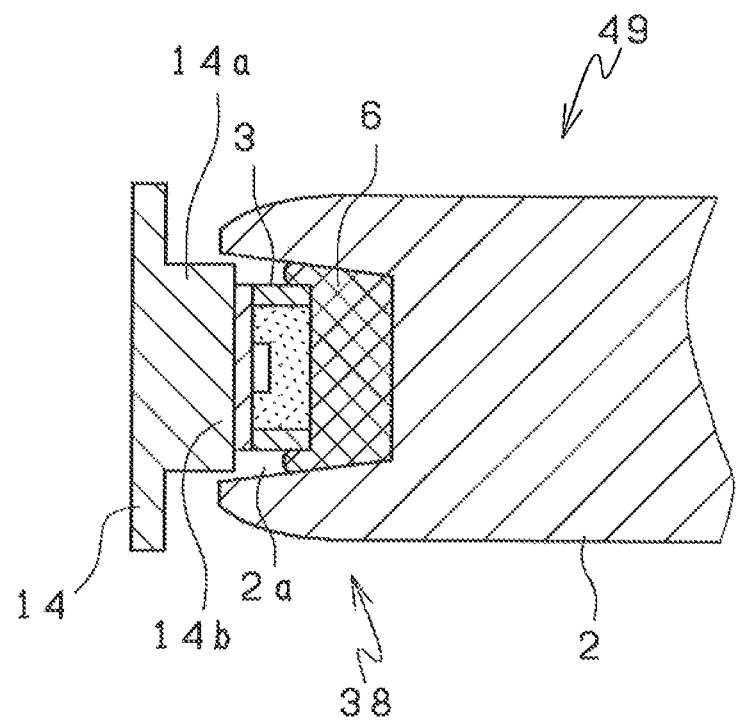
FIG. 20 is a sectional view of main components of a light source of a planar light unit according to a ninth embodiment.
Figure 21:
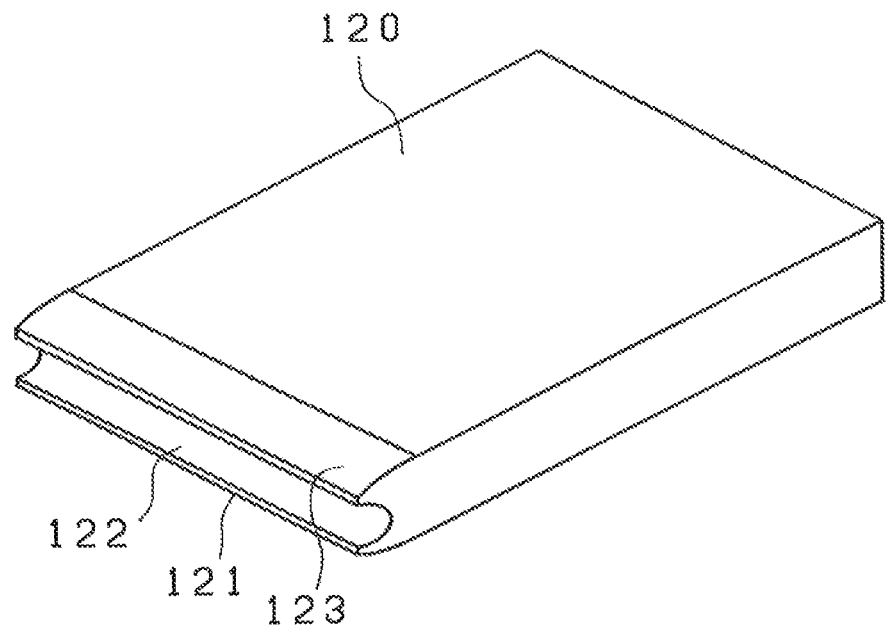
FIG. 21 is a perspective view of a light guide plate included in a planar light unit according to a conventional technique.
Figure 22:
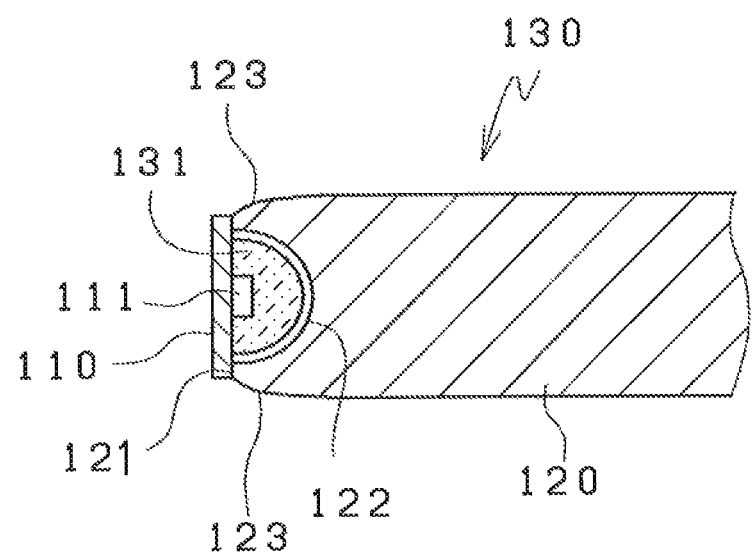
FIG. 22 is a sectional view of main components of a light source of the planar light unit illustrated in FIG. 21.

FIG. 20 is a sectional view of main components of the light source 38, which is included in the planar light unit 49. The sectional structure of the light source 38 illustrated in FIG. 20 is basically the same as the sectional structure of the light source 34 illustrated in FIG. 12. Thus, like reference numerals designate identical components, and redundant descriptions will be omitted.

The light source 38 of the planar light unit 49 is different from the light source 34 of the planar light unit 45 in the shape of a light source board 14. In the light source 34, the surface of the light source board 4 on the side of the light guide plate 2 is flat (see FIG. 12). By contrast, in the light source 38, the surface of the light source board 14 on the side of the light guide plate 2 includes a protrusion-shaped portion 14a at a portion where the light-emitting device 3 is mounted. With the planar light unit 49 assembled (with the light-emitting device 3, which is mounted on the protrusion-shaped portion 14a, pressing the flexible resin 6, which is disposed in the recess 2a of the light guide plate 2), a leading end 14b of the protrusion-shaped portion 14a is disposed inside the recess 2a.

Next, description will be made with regard to a movement in the light source 38 of the planar light unit 49 when a shock from vibration is applied to the light source 38 in comparison with a movement in the light source 34 of the planar light unit 45.

In the planar light unit 45 illustrated in FIG. 12, the leading end of the light-emitting device 3 is disposed inside the recess 2a, which is disposed in the light guide plate 2. In the case where a shock from vibration is applied to the light source 34, the leading end of the light-emitting device 3 is displaced and collides with an inner wall of the recess 2a, which is disposed in the light guide plate 2, through the flexible resin 6. The collision may cause a shock to the light-emitting device 3, resulting in the light-emitting device 3 being broken.

By contrast, in the planar light unit 49 illustrated in FIG. 20, the light-emitting device 3 and the protrusion-shaped portion 14a are disposed inside the recess 2a, which is disposed in the light guide plate 2. In the case where a shock from vibration is applied to this light source 38, the light-emitting device 3 may be displaced, but the leading end 14b of the protrusion-shaped portion 14a collides with the inner wall of the recess 2a of the light guide plate 2. Therefore, the light-emitting device 3 is prevented from being broken in the planar light unit 49. In addition to preventing the light-emitting device 3 from being broken by a shock from vibration, the light source 38 is reduced in size, with the light-emitting device 3 disposed inside the recess 2a.

As has been described hereinbefore, in the planar light unit according to the subject matter, the light-emitting unit and the light guide plate are connected to each other by pressing the flexible resin. This stabilizes the optical and mechanical connection between the light-emitting unit and the light guide plate. As a result, the planar light unit according to the subject matter efficiently guides the light emitted from the semiconductor light-emitting devices into the light guide plate. Moreover, in the planar light unit according to the subject matter, the flexible resin is deformable to absorb processing errors of the components and/or absorb thermal-expansion dimensional changes in the components. With this configuration, troubles such as damage to the planar light unit are prevented. Therefore, the present application ensures that a planar light unit superior in luminous efficiency and brightness uniformity on the light exit surface is mass-produced with stable quality.

DESCRIPTION OF THE REFERENCE NUMERAL

1 LED die
2, 23, 24, 120 Light guide plate
2a, 24a, 122 Recess
2b, 123 Reflecting-shaped portion
2c, 23c, 24c Light incident surface (bottom surface)
2d Protrusion
2f Light incident portion
2g Light exit surface
3 Light-emitting device
3L, 13L, 23L Light-emitting unit
3a Module board
3b Reflective resin frame
3c Sealing resin
4, 14, 110 Light source board
14a Protrusion-shaped portion
14b Leading end
6 Flexible resin
8 Elastic support member
9 Adhesive tape
10 Frame
20 Front light guide plate
21 Rear light guide plate
22 Wedge-shaped cutting portion
23i, 23j Side reflective portion
23k Individual housing
30, 31 to 38 Light source
40, 42 to 49 Planar light unit
50 Display device

The invention claimed is:

1. A planar light unit comprising:
a light guide plate comprising:
a light incident portion on a side edge of the light guide plate; and
a light exit surface on a top surface of the light guide plate;
a semiconductor light-emitting device configured to emit light into an inside of the light guide plate through the light incident portion;
a light source board on which the semiconductor light-emitting device is mounted; and
a flexible resin having a light-transmitting property and deformable flexibility,
wherein the light incident portion has a recess formed therein that is bored in parallel with the top surface of the light guide plate, and a light incident surface at a bottom of the recess,
wherein the recess formed in the light incident portion of the light guide plate has an approximately rectangular cross-section with a tapered shape that is wider at an entrance of the recess, and is configured to receive the flexible resin,
wherein the semiconductor light-emitting device mounted on the light source board is configured to be pressed against the flexible resin toward the recess,
wherein the flexible resin is configured to be compressed and flexibly deformed from an original prismatic shape so as to fit a shape of the recess,
wherein the semiconductor light-emitting device and the light guide plate are in substantially complete contact with each other through the flexible resin, and
wherein a reflecting-shaped portion is formed on at least one side among a top side and a bottom side of the light incident portion of the light guide plate.

2. The planar light unit according to claim 1, wherein the flexible resin has a Young's modulus of 0.1 to 1.0 MPa.

3. The planar light unit according to claim 1, further comprising at least one additional semiconductor light-emitting device mounted on the light source board such that there is a plurality of semiconductor light-emitting devices, wherein the flexible resin is a single continuous flexible resin disposed to cover all of the plurality of semiconductor light-emitting devices.

4. The planar light unit according to claim 1, further comprising:
- at least one additional semiconductor light-emitting device mounted on the light source board such that there is a plurality of semiconductor light-emitting devices; and
- at least one additional flexible resin such that an individual flexible resin is disposed at each of the plurality of semiconductor light-emitting devices.

5. The planar light unit according to claim 1, further comprising at least one additional semiconductor light-emitting device such that there is a plurality of semiconductor light-emitting devices,
wherein the recess comprises a plurality of individual housings each comprising a side reflective wall, and in each of the plurality of individual housings, the flexible resin is disposed between the light incident surface and a corresponding one of the plurality of semiconductor light-emitting devices.

6. The planar light unit according to claim 1, wherein the light source board comprises a protrusion-shaped portion on which the semiconductor light-emitting device is mounted, and a leading end of the protrusion-shaped portion is disposed inside the recess.

7. The planar light unit according to claim 1, wherein the semiconductor light-emitting device includes a plurality of LED dies mounted on the light source board, and a sealing resin that seals the plurality of LED dies in such a collective manner that the semiconductor light-emitting device and the light source board are integral to each other.

8. The planar light unit according to claim 7, wherein the sealing resin comprises the flexible resin.

9. The planar light unit according to claim 7, wherein the sealing resin comprises a light-transmitting resin mixed with fluorescent particles.

10. The planar light unit according to claim 1, wherein the light guide plate comprises at least two separate light guide plates, and the light guide plates are optically connected with each other.

11. The planar light unit according to claim 10, wherein a connection portion of the light guide plates has a wedge-shaped cross-section.

12. The planar light unit according to claim 1, wherein the light incident surface has an uneven shape.

13. The planar light unit according to claim 1, wherein a color of light emitted from the semiconductor light-emitting device is set to a longer wavelength than a wavelength of a chromaticity target of light that exits through the light exit surface.

14. The planar light unit according to claim 2, further comprising at least one additional semiconductor light-emitting device such that there is a plurality of semiconductor light-emitting devices,
wherein the recess comprises a plurality of individual housings each comprising a side reflective wall, and in each of the plurality of individual housings, the flexible resin is disposed between the light incident surface and a corresponding one of the plurality of semiconductor light-emitting devices.

15. The planar light unit according to claim 8, wherein the sealing resin comprises a light-transmitting resin mixed with fluorescent particles.

16. The planar light unit according to claim 2, wherein the flexible resin is deformable so as to absorb processing errors of components and/or thermal expansion deformation of the components caused by temperature characteristics of components.

* * * * *